(12) United States Patent
Kimura et al.

(10) Patent No.: US 12,191,840 B2
(45) Date of Patent: Jan. 7, 2025

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Sho Nagatomo, Nagaokakyo (JP); Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 484 days.

(21) Appl. No.: 17/701,978

(22) Filed: Mar. 23, 2022

(65) Prior Publication Data
US 2022/0216848 A1 Jul. 7, 2022

Related U.S. Application Data

(63) Continuation of application No. PCT/JP2020/036396, filed on Sep. 25, 2020.

(30) Foreign Application Priority Data

Sep. 27, 2019 (JP) .................. 2019-178101

(51) Int. Cl.
*H03H 9/13* (2006.01)
*H03H 9/02* (2006.01)
(Continued)

(52) U.S. Cl.
CPC .......... *H03H 9/13* (2013.01); *H03H 9/02031* (2013.01); *H03H 9/02228* (2013.01);
(Continued)

(58) Field of Classification Search
CPC .. H03H 9/13; H03H 9/02031; H03H 9/02228; H03H 9/174; H03H 9/175;
(Continued)

(56) References Cited

U.S. PATENT DOCUMENTS 8,304,967 B2 * 11/2012 Takizawa ................. H03H 9/21
                                                                          310/365
9,537,079 B2 * 1/2017 Ito ....................... H03H 9/02574
(Continued)

FOREIGN PATENT DOCUMENTS

| CN | 108139364 A | * 6/2018 | .......... B01L 3/50273 |
| CN | 109073601 A | * 12/2018 | ........... G01N 29/022 |

(Continued)

OTHER PUBLICATIONS

Official Communication issued in International Patent Application No. PCT/JP2020/036396 mailed on Dec. 15, 2020.

*Primary Examiner* — Daniel Pihulic
(74) *Attorney, Agent, or Firm* — Keating & Bennett, LLP

(57) ABSTRACT

An acoustic wave device includes a piezoelectric layer and first and second electrodes. The first and second electrodes face each other in a direction crossing a thickness direction of the piezoelectric layer. The acoustic wave device utilizes a bulk wave of a thickness-shear primary mode. The material of the piezoelectric layer is lithium niobate or lithium tantalate. The first and second electrodes include aluminum layers, respectively, on the piezoelectric layer. An orientation direction of a crystal of each of the aluminum layers is a direction orthogonal or substantially orthogonal to a second principal surface on the piezoelectric layer side of each of the aluminum layers.

20 Claims, 17 Drawing Sheets

(51) Int. Cl.
*H03H 9/17* (2006.01)
*H03H 9/56* (2006.01)

(52) U.S. Cl.
CPC ............ *H03H 9/174* (2013.01); *H03H 9/175* (2013.01); *H03H 9/176* (2013.01); *H03H 9/562* (2013.01); *H03H 9/564* (2013.01); *H03H 9/568* (2013.01)

(58) Field of Classification Search
CPC ........ H03H 9/176; H03H 9/562; H03H 9/564; H03H 9/568; H03H 9/02015; H03H 9/131; H03H 9/02157; H03H 9/15
See application file for complete search history.

(56) References Cited

U.S. PATENT DOCUMENTS

| | | | | |
|---|---|---|---|---|
| 10,553,778 | B2* | 2/2020 | Ito | H03H 9/14538 |
| 11,621,688 | B2* | 4/2023 | Yamane | H03H 9/174 |
| | | | | 333/192 |
| 2010/0320875 | A1* | 12/2010 | Takizawa | H03H 9/176 |
| | | | | 310/357 |
| 2011/0115334 | A1 | 5/2011 | Konishi et al. | |
| 2013/0057360 | A1 | 3/2013 | Meltaus et al. | |
| 2014/0191619 | A1* | 7/2014 | Ito | H10N 30/073 |
| | | | | 216/13 |
| 2017/0062698 | A1* | 3/2017 | Ito | H10N 30/877 |
| 2022/0216392 | A1* | 7/2022 | Yamane | H03H 9/02015 |
| 2022/0216842 | A1* | 7/2022 | Nagatomo | H03H 9/02031 |
| 2022/0216843 | A1* | 7/2022 | Nagatomo | H03H 9/176 |
| 2022/0216844 | A1* | 7/2022 | Yamane | H03H 9/564 |
| 2022/0216845 | A1* | 7/2022 | Yamane | H03H 9/02015 |
| 2022/0216846 | A1* | 7/2022 | Yamane | H03H 9/02031 |
| 2022/0216848 | A1* | 7/2022 | Kimura | H03H 9/13 |
| 2022/0216849 | A1* | 7/2022 | Kimura | H03H 9/132 |
| 2022/0216854 | A1* | 7/2022 | Yamane | H03H 9/174 |
| 2022/0224305 | A1* | 7/2022 | Kimura | H03H 9/0211 |

FOREIGN PATENT DOCUMENTS

| | | | | | |
|---|---|---|---|---|---|
| CN | 114467254 | A | * | 5/2022 | ......... H03H 9/02031 |
| CN | 115836141 | A | * | 3/2023 | ............ C23C 14/02 |
| EP | 2690782 | A1 | * | 1/2014 | ............ B21B 37/42 |
| EP | 2690782 | B1 | * | 9/2020 | ............ B21B 37/42 |
| JP | 08-204483 | A | | 8/1996 | |
| JP | 2011-109306 | A | | 6/2011 | |
| JP | 2012-257019 | A | | 12/2012 | |
| JP | 2013-528996 | A | | 7/2013 | |
| JP | 7147865 | B2 | * | 10/2022 | ......... H03H 9/02574 |
| WO | WO-2012128268 | A1 | * | 9/2012 | ............ B21B 37/42 |
| WO | WO-2021060508 | A1 | * | 4/2021 | ......... H03H 9/02031 |
| WO | WO-2021060521 | A1 | * | 4/2021 | ......... H03H 9/02031 |
| WO | WO-2021060522 | A1 | * | 4/2021 | ......... H03H 9/02031 |
| WO | WO-2021060523 | A1 | * | 4/2021 | ......... H03H 9/02031 |

* cited by examiner

ACOUSTIC WAVE DEVICE

CROSS REFERENCE TO RELATED APPLICATIONS

This application claims the benefit of priority to Japanese Patent Application No. 2019-178101 filed on Sep. 27, 2019 and is a Continuation Application of PCT Application No. PCT/JP2020/036396 filed on Sep. 25, 2020. The entire contents of each application are hereby incorporated herein by reference.

BACKGROUND OF THE INVENTION

1. Field of the Invention

The present invention relates to acoustic wave devices generally, and more specifically, to acoustic wave devices including piezoelectric layers.

2. Description of the Related Art

Acoustic wave devices using plate waves propagating through piezoelectric layers made of $LiNbO_3$ or $LiTaO_3$ have been known. For example, Japanese Unexamined Patent Application Publication No. 2012-257019 discloses an acoustic wave device using a Lamb wave as a plate wave. In the acoustic wave device described in Japanese Unexamined Patent Application Publication No. 2012-257019, an interdigital transducer (IDT) electrode (a first electrode and a second electrode) is provided on an upper surface of a piezoelectric substrate (piezoelectric layer) made of $LiNbO_3$ or $LiTaO_3$. Then, when a voltage is applied between a plurality of electrode fingers connected to one potential of the IDT electrode and a plurality of electrode fingers connected to the other potential thereof, a Lamb wave is excited. Reflectors are provided on both sides of the IDT electrode, and the IDT electrode and the reflectors define an acoustic wave resonator using a plate wave.

In the acoustic wave device described in Japanese Unexamined Patent Application Publication No. 2012-257019, it is conceivable to reduce the number of electrode fingers in order to miniaturize the device. However, when the number of electrode fingers is reduced, there arises a problem that the Q value is lowered. Further, it is difficult for the acoustic wave device described in Japanese Unexamined Patent Application Publication No. 2012-257019 to improve distortion characteristics.

SUMMARY OF THE INVENTION

Preferred embodiments of the present invention provide acoustic wave devices that are each able to increase a Q value and to improve distortion characteristics even when miniaturization is achieved.

An acoustic wave device according to a preferred embodiment of the present invention includes a piezoelectric layer, a first electrode, and a second electrode. The first electrode and the second electrode face each other in a direction crossing a thickness direction of the piezoelectric layer. The acoustic wave device utilizes a bulk wave of a thickness-shear primary mode. A material of the piezoelectric layer is lithium niobate or lithium tantalate. Each of the first electrode and the second electrode includes an aluminum layer on the piezoelectric layer. An orientation direction of a crystal defining the aluminum layer is orthogonal or substantially orthogonal to a surface on the piezoelectric layer side of the aluminum layer.

An acoustic wave device according to a preferred embodiment of the present invention includes a piezoelectric layer, a first electrode, and a second electrode. The first electrode and the second electrode face each other in a direction crossing a thickness direction of the piezoelectric layer. The first electrode and the second electrode are adjacent to each other. When a distance between a center line of the first electrode and a center line of the second electrode is denoted as p, and a thickness of the piezoelectric layer is denoted as d, d/p is not greater than about 0.5 in any cross section along the thickness direction in the acoustic wave device. A material of the piezoelectric layer is lithium niobate or lithium tantalate. Each of the first electrode and the second electrode includes an aluminum layer on the piezoelectric layer. An orientation direction of a crystal defining the aluminum layer is orthogonal or substantially orthogonal to a surface on the piezoelectric layer side of the aluminum layer.

With each of preferred embodiments of the present invention, the Q value is able to be increased and the distortion characteristics are able be improved even when the size of the device is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
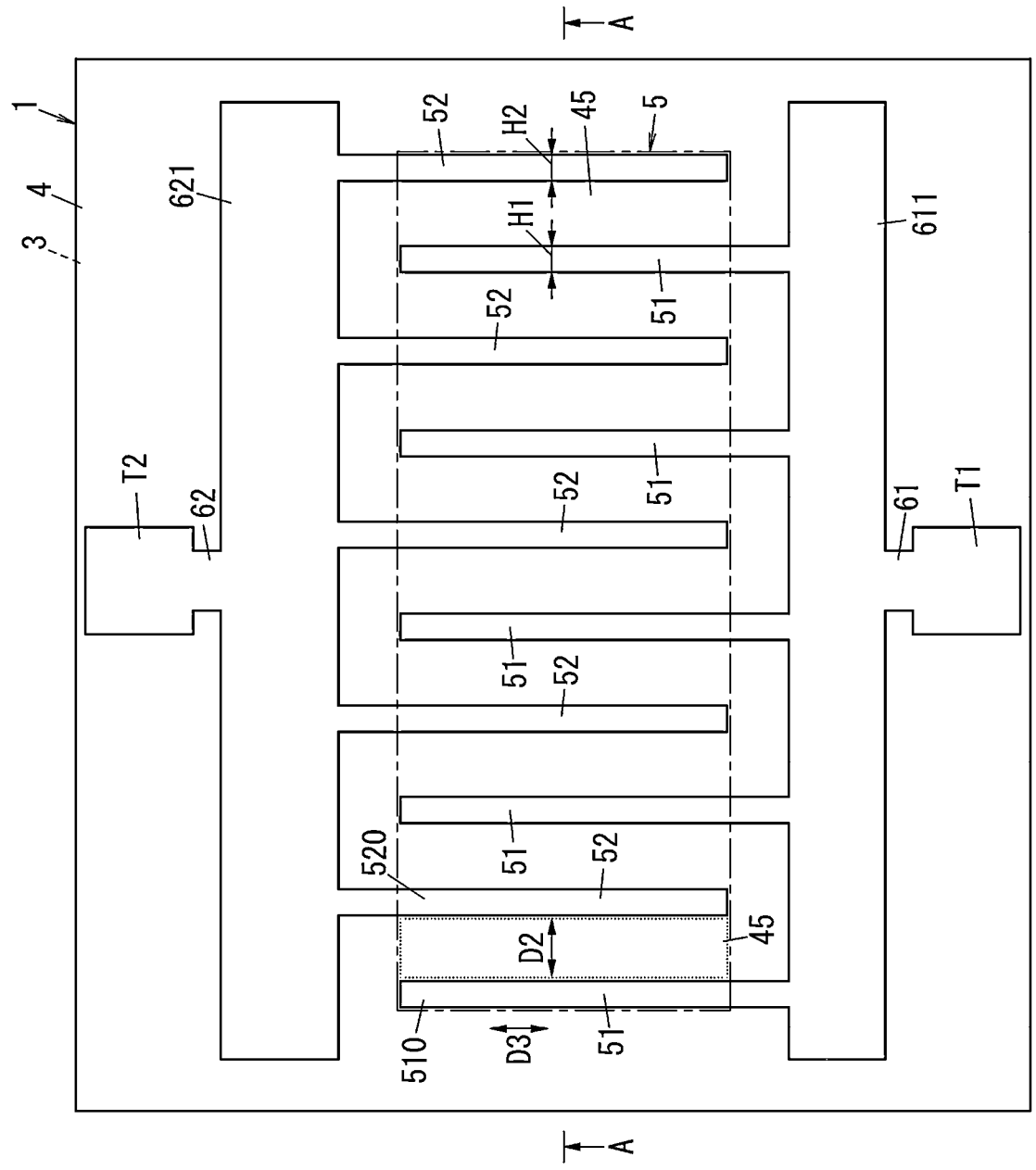
FIG. 1 is a plan view of an acoustic wave device according to Preferred Embodiment 1 of the present invention.

Preferred embodiments of the present invention will be described below with reference to the drawings.

FIGS. 1 to 6, FIG. 11, and FIGS. 13 to 18 referred to in the following preferred embodiments and the like are schematic diagrams, and ratios of sizes, thicknesses, and the like of elements in the drawing do not necessarily reflect actual dimensional ratios.

Preferred Embodiment 1

Hereinafter, an acoustic wave device 1 according to Preferred Embodiment 1 of the present invention will be described with reference to FIGS. 1 to 3.

(1.1) Overall Configuration of Acoustic Wave Device

Figure 2A:
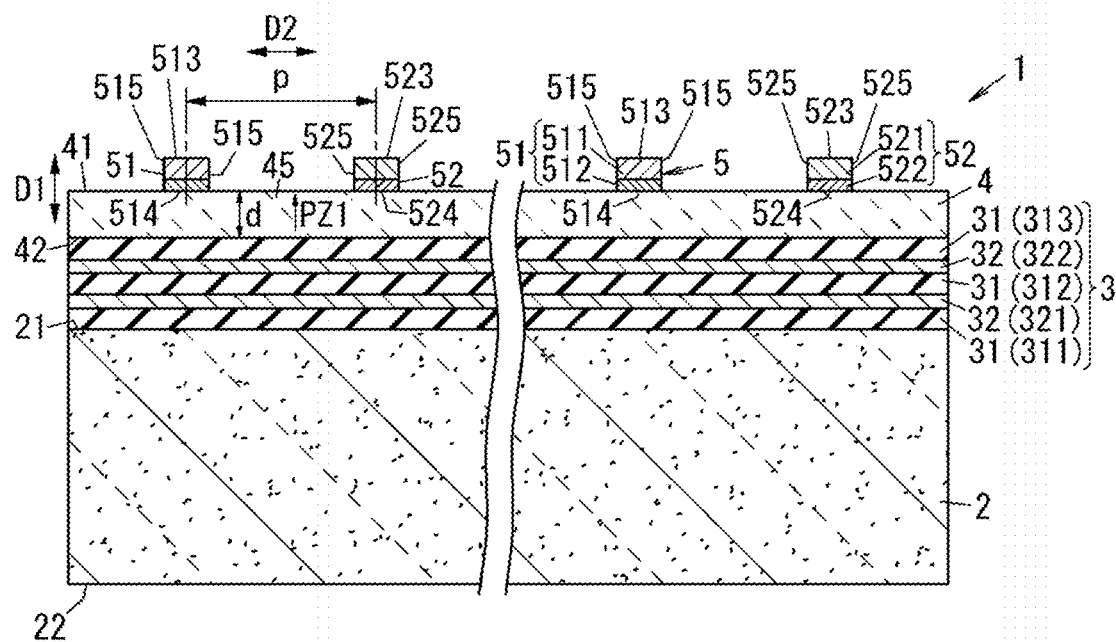
FIG. 2A is a cross-sectional view of the acoustic wave device taken along a line A-A in FIG. 1.

The acoustic wave device 1 according to Preferred Embodiment 1 includes a piezoelectric layer 4, a first electrode 51, and a second electrode 52, as illustrated in FIG. 1. The first electrode 51 and the second electrode 52 face each other in a direction D2 (hereinafter, also referred to as a "second direction D2") crossing a thickness direction D1 (hereinafter, also referred to as a "first direction D1") of the piezoelectric layer 4, as illustrated in FIG. 2A. The acoustic wave device 1 utilizes a bulk wave of a thickness-shear primary mode. The second direction D2 is orthogonal or substantially orthogonal to a polarization direction PZ1 of the piezoelectric layer 4. The bulk wave of the thickness-shear primary mode is a bulk wave whose propagation direction is the thickness direction D1 of the piezoelectric layer 4 produced by thickness-shear vibrations of the piezoelectric layer 4, and the number of nodes of the wave is one in the thickness direction D1 of the piezoelectric layer 4. The thickness-shear vibrations are excited by the first electrode 51 and the second electrode 52. The thickness-shear vibrations are excited in a defined region 45 between the first electrode 51 and the second electrode 52 in the piezoelectric layer 4 in a plan view from the thickness direction D1. In the acoustic wave device 1, when the second direction D2 is orthogonal or substantially orthogonal to the polarization direction PZ1 of the piezoelectric layer 4, an electromechanical coupling coefficient (hereinafter, also referred to as a coupling coefficient) of the bulk wave of the thickness-shear primary mode is large. Here, "orthogonal" is not limited to being strictly orthogonal, and may be substantially orthogonal (an angle between the second direction D2 and the polarization direction PZ1 is, for example, about 90°±10°).

As illustrated in FIG. 1 and FIG. 2A, the first electrode 51 and the second electrode 52 intersect with each other when viewed from the second direction D2. The expression "intersect with each other when viewed from the second direction D2" means that the electrodes overlap each other when viewed from the second direction D2. The acoustic wave device 1 further includes a first wiring portion 61 connected to the first electrode 51 and a second wiring portion 62 connected to the second electrode 52. The first wiring portion 61 is connected to a first terminal T1. The second wiring portion 62 is connected to a second terminal T2 different from the first terminal T1. The acoustic wave device 1 includes a plurality of the first electrodes 51 and a plurality of the second electrodes 52. That is, in the case where the first electrode 51 and the second electrode 52 define a set of paired electrodes, the acoustic wave device 1 includes a plurality of sets of paired electrodes. In the acoustic wave device 1, the plurality of first electrodes 51 and the plurality of second electrodes 52 are alternately provided one by one in the second direction D2. In the acoustic wave device 1, the plurality of first electrodes 51 is connected to one first wiring portion 61, and the plurality of second electrodes 52 is connected to one second wiring portion 62.

The acoustic wave device 1 includes a support substrate 2, an acoustic reflection layer 3, the piezoelectric layer 4, the first electrode 51, and the second electrode 52, as illustrated in FIG. 2A. The acoustic reflection layer 3 is provided on the support substrate 2. The piezoelectric layer 4 is provided on the acoustic reflection layer 3. The first electrode 51 and the second electrode 52 are in contact with the piezoelectric layer 4. The acoustic reflection layer 3 includes at least one (for example, two) high acoustic impedance layer 32 and at least one (for example, three) low acoustic impedance layer 31. The low acoustic impedance layer 31 has an acoustic impedance lower than that of the high acoustic impedance layer 32. The acoustic wave device 1 includes, as a resonator, an acoustic wave resonator 5 including the first electrode 51, the second electrode 52, and the piezoelectric layer 4. In the acoustic wave device 1, the acoustic wave resonator 5 further includes the acoustic reflection layer 3 described above.

(1.2) Elements of Acoustic Wave Device

Next, each of the elements of the acoustic wave device 1 will be described with reference to the drawings.

(1.2.1) Support Substrate

As illustrated in FIG. 2A, the support substrate 2 supports the piezoelectric layer 4. In the acoustic wave device 1 according to Preferred Embodiment 1, the support substrate 2 also supports the acoustic reflection layer 3, and supports the piezoelectric layer 4 and the first electrode 51 as well as the second electrode 52 with the acoustic reflection layer 3 interposed therebetween.

The support substrate 2 includes a first principal surface 21 and a second principal surface 22 facing each other. The first principal surface 21 and the second principal surface 22 face each other in a thickness direction of the support substrate 2. The thickness direction of the support substrate 2 is a direction along the thickness direction D1 of the piezoelectric layer 4. In a plan view from the thickness direction D1 of the piezoelectric layer 4, the outer peripheral shape of the support substrate 2 is rectangular or substantially rectangular, but is not limited thereto, and may be, for example, a square or substantially square shape.

The support substrate 2 is, for example, a silicon substrate. The thickness of the support substrate 2 is, for example, about 120 μm, but is not limited thereto. The silicon substrate is according to Modification 1 of Preferred Embodiment 1 of the present invention, for example, a single crystal silicon substrate. When the support substrate 2 is a silicon substrate, the plane orientation of the first principal surface 21 may be, for example, a (100) plane, (110) plane, or (111) plane. The propagation direction of the bulk wave may be set without being restricted by the plane orientation of the silicon substrate. The resistivity of the silicon substrate is, for example, about 1 kΩcm or more, preferably about 2 kΩcm or more, and more preferably about 4 kΩcm or more.

The support substrate 2 is not limited to a silicon substrate, and may be, for example, a quartz substrate, a glass substrate, a sapphire substrate, a lithium tantalate substrate, a lithium niobate substrate, an alumina substrate, a spinel substrate, a gallium arsenide substrate, or a silicon carbide substrate.

(1.2.2) Acoustic Reflection Layer

The acoustic reflection layer 3 is provided on the first principal surface 21 of the support substrate 2 as illustrated in FIG. 2A. The acoustic reflection layer 3 faces the first electrode 51 and the second electrode 52 in the thickness direction D1 of the piezoelectric layer 4.

The acoustic reflection layer 3 reduces or prevents the leakage of the bulk waves (bulk waves of the thickness-shear primary mode described above) excited by the first electrode 51 and the second electrode 52 into the support substrate 2. By including the acoustic reflection layer 3, the acoustic wave device 1 may improve an effect of confining acoustic wave energy in the piezoelectric layer 4. Because of this, the acoustic wave device 1 may reduce the loss and increase the Q value as compared with a case of not including the acoustic reflection layer 3.

The acoustic reflection layer 3 has a laminated structure including a plurality of (three) low acoustic impedance layers 31 and a plurality of (two) high acoustic impedance layers 32 alternately provided one by one in the thickness direction D1 of the piezoelectric layer 4. The acoustic impedance of the low acoustic impedance layer 31 is lower than the acoustic impedance of the high acoustic impedance layer 32.

Hereinafter, for convenience of description, in the acoustic reflection layer 3, the two high acoustic impedance layers 32 may be referred to as a first high acoustic impedance layer 321 and a second high acoustic impedance layer 322 in the order of closeness to the first principal surface 21 of the support substrate 2. The three low acoustic impedance layers 31 may be referred to as a first low acoustic impedance layer 311, a second low acoustic impedance layer 312, and a third low acoustic impedance layer 313 in the order of closeness to the first principal surface 21 of the support substrate 2.

In the acoustic reflection layer 3, the first low acoustic impedance layer 311, the first high acoustic impedance layer 321, the second low acoustic impedance layer 312, the second high acoustic impedance layer 322, and the third low acoustic impedance layer 313 are provided in this order from the support substrate 2 side. Accordingly, the acoustic reflection layer 3 may reflect the bulk wave (bulk wave of the thickness-shear primary mode) from the piezoelectric layer 4 at each of an interface between the third low acoustic impedance layer 313 and the second high acoustic impedance layer 322, an interface between the second high acoustic impedance layer 322 and the second low acoustic impedance layer 312, an interface between the second low acoustic impedance layer 312 and the first high acoustic impedance layer 321, and an interface between the first high acoustic impedance layer 321 and the first low acoustic impedance layer 311.

The material of the plurality of high acoustic impedance layers 32 is, for example, platinum (Pt). The material of the plurality of low acoustic impedance layers 31 is, for example, silicon oxide. The thickness of each of the plurality of high acoustic impedance layers 32 is, for example, about 94 nm. The thickness of each of the plurality of low acoustic impedance layers 31 is, for example, about 188 nm. The acoustic reflection layer 3 includes two conductive layers because each of the two high acoustic impedance layers 32 is made of platinum.

The material of the plurality of high acoustic impedance layers 32 is not limited to Pt, and may be a metal such as, for example, tungsten (W) or tantalum (Ta). The material of the plurality of high acoustic impedance layers 32 is not limited to metal, and may be, for example, an insulator.

The plurality of high acoustic impedance layers 32 is not limited to being made of the same material, and may be made of mutually different materials, for example. The plurality of low acoustic impedance layers 31 is not limited to being made of the same material, and may be made of mutually different materials, for example.

Further, the number of low acoustic impedance layers 31 in the acoustic reflection layer 3 is not limited to three, and may be one, two, or four or more. The number of high acoustic impedance layers 32 in the acoustic reflection layer 3 is not limited to two, and may be one or three or more. The number of high acoustic impedance layers 32 and the number of low acoustic impedance layers 31 are not limited to being different, and may be the same, or the number of low acoustic impedance layers 31 may be less than the number of high acoustic impedance layers 32 by one.

The film thickness of each of the high acoustic impedance layers 32 and the low acoustic impedance layers 31 in the acoustic reflection layer 3 is appropriately set in accordance with the desired frequency of the acoustic wave device 1 and the material applied to each of the high acoustic impedance layers 32 and the low acoustic impedance layers 31 in order to obtain favorable reflection in the acoustic reflection layer 3.

(1.2.3) Piezoelectric Layer

The piezoelectric layer 4 includes a first principal surface 41 and a second principal surface 42 facing each other, as illustrated in FIG. 2A. The first principal surface 41 and the second principal surface 42 face each other in the thickness direction D1 of the piezoelectric layer 4. In the piezoelectric layer 4, of the first principal surface 41 and the second principal surface 42, the first principal surface 41 is located on the first electrode 51 side and the second electrode 52 side, and the second principal surface 42 is located on the acoustic reflection layer 3 side. Accordingly, in the acoustic wave device 1, the distance between the first principal surface 41 of the piezoelectric layer 4 and the acoustic reflection layer 3 is longer than the distance between the second principal surface 42 of the piezoelectric layer 4 and the acoustic reflection layer 3. The material of the piezoelectric layer 4 is, for example, lithium niobate ($LiNbO_3$) or lithium tantalate ($LiTaO_3$). The piezoelectric layer 4 is, for example, a Z-cut $LiNbO_3$ or a Z-cut $LiTaO_3$. With regard to the Euler angles ($\varphi$, $\theta$, $\psi$) of the piezoelectric layer 4, for example, $\varphi$ is about $0°\pm10°$ and $\theta$ is about $0°\pm10°$. Any angle may be used for $\psi$. From the viewpoint of increasing the coupling coefficient, the piezoelectric layer 4 is preferably made of a Z-cut $LiNbO_3$ or a Z-cut $LiTaO_3$. The propagation orientation may be a Y-axis direction, an X-axis direction, or a direction rotated within a range of about $\pm90°$ from an X-axis in crystal axes (X, Y, Z) defined for the crystal structure of the piezoelectric layer 4. The piezoelectric layer 4 is, for example, a single crystal, but is not limited thereto. For example, the piezoelectric layer 4 may be a twin crystal or ceramics.

The thickness of the piezoelectric layer 4 is, for example, in a range from about 50 nm to about 1000 nm, and is about 400 nm as an example.

The piezoelectric layer 4 includes the defined region 45. In a plan view from the thickness direction D1 of the piezoelectric layer 4, the defined region 45 is a region intersecting with both the first electrode 51 and the second electrode 52 in a direction in which the first electrode 51 and the second electrode 52 face each other in the piezoelectric layer 4, and located between the first electrode 51 and the second electrode 52.

(1.2.4) Electrodes

In the acoustic wave device 1, of the first electrode 51 and the second electrode 52, the first electrode 51 is a hot electrode, and the second electrode 52 is a ground electrode. In the acoustic wave device 1, the plurality of first electrodes 51 and the plurality of second electrodes 52 are alternately provided one by one being separated from each other. Accordingly, the first electrode 51 and the second electrode 52 adjacent to each other are separated from each other. The distance between the center lines of the first electrode 51 and the second electrode 52 adjacent to each other is, for example, in a range from about 1 µm to about 10 µm, and is about 3 µm as an example. In this case, the first electrode 51 and the second electrode 52 being "adjacent to each other" refers to a case in which the first electrode 51 and the second electrode 52 face each other with a gap interposed therebetween.

A group of electrodes including the plurality of first electrodes 51 and the plurality of second electrodes 52 is only required to have a configuration in which the plurality of first electrodes 51 and the plurality of second electrodes 52 are provided in the second direction D2 being separated from each other, and may have a configuration in which the plurality of first electrodes 51 and the plurality of second electrodes 52 are not alternately provided are separated from each other. For example, a region in which the first electrodes 51 and the second electrodes 52 are provided one by one and separated from each other, and a region in which two first electrodes 51 or two second electrodes 52 are provided in the second direction D2 may be mixed. In addition, for example, one or more of the plurality of first electrodes 51 or of the plurality of second electrodes 52 may be in an electrically floating state.

The plurality of first electrodes 51 and the plurality of second electrodes 52 each have an elongated (linear) shape in a plan view from the thickness direction D1 of the piezoelectric layer 4, where a third direction D3 orthogonal or substantially orthogonal to the second direction D2 is a longitudinal direction and the second direction D2 is a width direction, as illustrated in FIG. 1. The length of each of the plurality of first electrodes 51 is, for example, about 20 µm, but is not limited thereto. A width H1 (first electrode width H1) of each of the plurality of first electrodes 51 is, for example, in a range from about 50 nm to about 1000 nm, and is about 500 nm as an example. The length of each of the plurality of second electrodes 52 is, for example, about 20 µm, but is not limited thereto. A width H2 (second electrode width H2) of each of the plurality of second electrodes 52 is, for example, in a range from about 50 nm to about 1000 nm, and is about 500 nm as an example.

The first electrode 51 includes a first electrode principal portion 510. The first electrode principal portion 510 is a portion of the first electrode 51 intersecting with the second electrode 52 in a direction in which the first electrode 51 and the second electrode 52 face each other. The second electrode 52 includes a second electrode principal portion 520. The second electrode principal portion 520 is a portion of the second electrode 52 intersecting with the first electrode 51 in the direction in which the first electrode 51 and the second electrode 52 face each other.

Each of the plurality of first electrodes 51 includes a laminated film including a main electrode film 511 and a close contact film 512, as illustrated in FIG. 2A. Each of the plurality of second electrodes 52 includes a laminated film including a main electrode film 521 and a close contact film 522, as illustrated in FIG. 2A. The main electrode films 511 and 521 are provided on the close contact films 512 and 522, respectively. That is, the main electrode films 511 and 521 are provided on the piezoelectric layer 4 with the close contact films 512 and 522 respectively interposed therebetween. The main electrode films 511 and 521 are each made of, for example, an Al film or AlCu film. The close contact films 512 and 522 are each made of, for example, a Ti film. The main electrode films 511 and 521 have a thickness of, for example, about 80 nm. The close contact films 512 and 522 have a thickness of, for example, about 10 nm. When the main electrode films 511 and 521 are, for example, AlCu films, it is preferable for Cu to be, for example, about 1 wt % to about 20 wt %. The main electrode films 511 and 521 are not limited to the Al films or AlCu films, and may be each include, for example, an alloy including aluminum (Al) as a main ingredient, and also including manganese (Mn) or silicon (Si). In the acoustic wave device 1 according to Preferred Embodiment 1, the main electrode films 511 and 521 are, for example, aluminum layers.

Figure 2B:
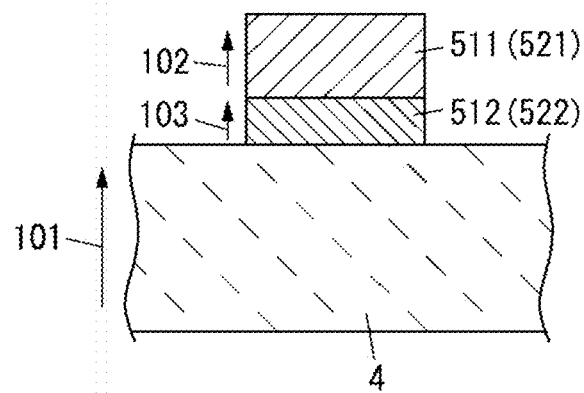
FIG. 2B is an enlarged view of a portion of FIG. 2A.
Figure 3:
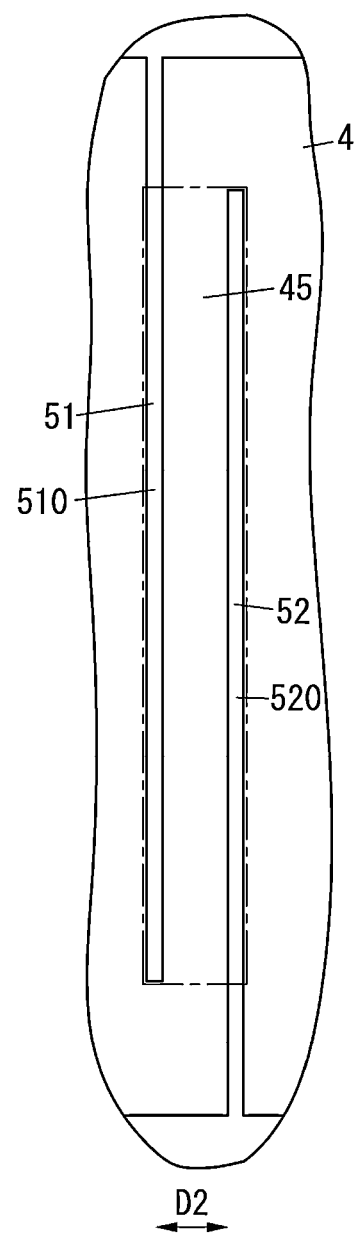
FIG. 3 is a plan view of a main section of the acoustic wave device according to Preferred Embodiment 1 of the present invention.

As illustrated in FIG. 2B, in the acoustic wave device 1 according to Preferred Embodiment 1, the <111> direction of the crystal of the main electrode film 511 as an aluminum layer is a direction orthogonal or substantially orthogonal to a surface on the piezoelectric layer 4 side of the main electrode film 511 (here, a surface on the close contact film 512 side of the main electrode film 511). In other words, the <111> direction of the crystal of the main electrode film 511 as an aluminum layer is a direction orthogonal or substantially orthogonal to a principal surface (in this case, the first principal surface 41) of the piezoelectric layer 4. A C-axis 101 of the piezoelectric layer 4 is a Z-axis direction in the crystal axes (X, Y, Z) defined for the crystal structure of the piezoelectric layer 4. Here, "orthogonal" is not limited to being strictly orthogonal, and may be substantially orthogonal (an angle formed by the first principal surface 41 and the C-axis 101 of the piezoelectric layer 4 is, for example, about $90°\pm10°$). The <111> direction of the crystal if the main electrode film 511 as an aluminum layer is an orientation direction of the crystal of the main electrode film 511.

In the acoustic wave device 1 according to Preferred Embodiment 1, as illustrated in FIG. 2B, an orientation axis 102 of the main electrode film (aluminum layer) 521 defining a portion of the second electrode 52, an orientation axis 103 of the close contact film 522 defining a portion of the second electrode 52, and the C-axis 101 of the piezoelectric layer 4 are oriented in the same or substantially the same direction. In other words, the <111> direction (orientation axis 102) of the crystal of the main electrode film 521 as an aluminum layer is a direction orthogonal or substantially orthogonal to the surface on the piezoelectric layer 4 side of the main electrode film 521 (here, the surface on the close contact film 522 side of the main electrode film 521). To further rephrase, the <111> direction of the crystal of the main electrode film 521 as an aluminum layer is a direction orthogonal or substantially orthogonal to the principal surface (in this case, the first principal surface 41) of the piezoelectric layer 4.

In the acoustic wave device 1 according to Preferred Embodiment 1, the main electrode films 511 and 521 as aluminum layers are epitaxial layers. In this case, the "epitaxial layer" refers to a metal layer grown with the same or substantially the same orientation as that of a single crystal defining and functioning as the base material. In Preferred Embodiment 1, the orientation of the main electrode films 511 and 521 as the epitaxial layers is the same or substantially the same as the orientation of the piezoelectric layer 4.

Herein, it is assumed that the orientation axis 102 of the main electrode films 511 and 521 is inclined with respect to the first principal surface 41 of the piezoelectric layer 4. In this case, when the acoustic wave resonator 5 is excited, intermodulation distortion (IMD) is generated between an input signal and an output signal due to the inclination of the orientation axis 102 of the main electrode films 511 and 521. In contrast, in the acoustic wave device 1 according to Preferred Embodiment 1, because the orientation axis 102 of the main electrode films 511 and 521 is orthogonal or substantially orthogonal to the first principal surface 41 of the piezoelectric layer 4, it is possible to reduce or prevent the generation of distortion between the input signal and the output signal. In other words, the acoustic wave device 1 according to Preferred Embodiment 1 may improve distortion characteristics.

In the acoustic wave device 1 according to Preferred Embodiment 1, the plurality of first electrodes 51 has the same or substantially the same first electrode width H1, but is not limited to the same or substantially the same width, and may have different widths. In the acoustic wave device 1 according to Preferred Embodiment 1, the plurality of second electrodes 52 has the same or substantially the same second electrode width H2, but is not limited to the same or substantially the same width, and may have different widths. In the acoustic wave device 1 according to Preferred Embodiment 1, the first electrode width H1 is equal or substantially equal to the second electrode width H2, but is not limited thereto. The first electrode width H1 may differ in size from the second electrode width H2.

With regard to the acoustic wave device 1 according to Preferred Embodiment 1, although the number of first electrodes 51 and the number of second electrodes 52 are, for example, both five in FIG. 1, each of the number of first electrodes 51 and the number of second electrodes 52 is not limited to five, and may be one, two to four, six or more, or fifty or more.

The second direction D2, in which the first electrode 51 and the second electrode 52 face each other, is preferably orthogonal or substantially orthogonal to the polarization direction PZ1 of the piezoelectric layer 4 (see FIG. 2A), but is not limited thereto. For example, in a case where the piezoelectric layer 4 is not a Z-cut piezoelectric body, the first electrode 51 and the second electrode 52 may face each other in a direction orthogonal or substantially orthogonal to the third direction D3, which is the longitudinal direction. The first electrode 51 and the second electrode 52 are not rectangular or substantially rectangular in some case. In such case, the third direction D3, which is the longitudinal direction, may be a long side direction of a circumscribed polygon that circumscribes the first electrode 51 and the second electrode 52 in a plan view of the first electrode 51 and the second electrode 52. In the case where the first wiring portion 61 and the second wiring portion 62 are connected to the first electrode 51 and the second electrode 52, respectively, the "circumscribed polygon that circumscribes the first electrode 51 and the second electrode 52" includes a polygon circumscribing at least portions of the first electrode 51 and the second electrode 52 excluding the portion connected to the first wiring portion 61 or the second wiring portion 62.

In the acoustic wave device 1, each of the plurality of first electrodes 51 is provided on the first principal surface 41 of the piezoelectric layer 4, as illustrated in FIG. 2A. In the acoustic wave device 1, each of the plurality of second electrodes 52 is provided on the first principal surface 41 of the piezoelectric layer 4. That is, in the acoustic wave device 1, the first electrode 51 and the second electrode 52 are provided on the same principal surface (in this case, the first principal surface 41) of the piezoelectric layer 4, and face each other on the same principal surface.

In the acoustic wave device 1 according to Preferred Embodiment 1, the thickness of each of the plurality of first electrodes 51 is smaller than the thickness of the piezoelectric layer 4. Each of the plurality of first electrodes 51 includes a first principal surface 513 and a second principal surface 514 crossing the thickness direction D1 of the piezoelectric layer 4, and two side surfaces 515 and 515 crossing the width direction of the first electrode 51. In each of the plurality of first electrodes 51, the second principal surface 514 of the first principal surface 513 and the second principal surface 514 is located on the acoustic reflection layer 3 side. Accordingly, in the acoustic wave device 1, the shortest distance from the first principal surface 513 of the first electrode 51 to the acoustic reflection layer 3 is longer than the shortest distance from the second principal surface 514 of the first electrode 51 to the acoustic reflection layer 3. In each of the plurality of first electrodes 51, the second principal surface 514 is in planar contact with the piezoelectric layer 4.

In the acoustic wave device 1 according to Preferred Embodiment 1, the thickness of each of the plurality of second electrodes 52 is smaller than the thickness of the piezoelectric layer 4. Each of the plurality of second electrodes 52 includes a first principal surface 523 and a second principal surface 524 crossing the thickness direction D1 of the piezoelectric layer 4, and two side surfaces 525 and 525 crossing the width direction of the second electrode 52. In each of the plurality of second electrodes 52, the second principal surface 524 of the first principal surface 523 and the second principal surface 524 is located on the acoustic reflection layer 3 side. Accordingly, in the acoustic wave device 1, the shortest distance from the first principal surface 523 of the second electrode 52 to the acoustic reflection layer 3 is longer than the shortest distance from the second principal surface 524 of the second electrode 52 to the acoustic reflection layer 3. In each of the plurality of second electrodes 52, the second principal surface 524 is in planar contact with the piezoelectric layer 4.

(1.2.5) First Wiring Portion and Second Wiring Portion

The first wiring portion 61 includes a first busbar 611. The first busbar 611 is a conductor portion configured to cause the plurality of first electrodes 51 to have the same potential. The first busbar 611 has an elongated shape (linear shape) whose longitudinal direction is in the second direction D2. The plurality of first electrodes 51 connected to the first busbar 611 extend toward a second busbar 621. In the acoustic wave device 1, a first conductor portion including the plurality of first electrodes 51 and the first busbar 611 has a comb shape in a plan view from the thickness direction D1 of the piezoelectric layer 4. The first busbar 611 is integrally provided with the plurality of first electrodes 51, but is not limited thereto.

The second wiring portion 62 includes the second busbar 621. The second busbar 621 is a conductor portion configured to cause the plurality of second electrodes 52 to have the same potential. The second busbar 621 has an elongated shape (linear shape) whose longitudinal direction is in the second direction D2. The plurality of second electrodes 52 connected to the second busbar 621 extend toward the first busbar 611. In the acoustic wave device 1, a second conductor portion including the plurality of second electrodes 52 and the second busbar 621 has a comb shape in the plan view from the thickness direction D1 of the piezoelectric layer 4. The second busbar 621 is integrally provided with the plurality of second electrodes 52, but is not limited thereto.

The first busbar 611 and the second busbar 621 face each other in the third direction D3. The third direction D3 is a direction orthogonal or substantially orthogonal to both the first direction D1 and the second direction D2.

The first wiring portion 61 and the second wiring portion 62 are electrically conductive. The material of the first wiring portion 61 and the second wiring portion 62 is, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main ingredient. The first wiring portion 61 and the second wiring portion 62 may include a plurality of metal films made of these metals or alloys that are laminated. Each of the first wiring portion 61 and the second wiring portion 62 includes, for example, a laminated film of a close contact film made of a Ti film and a main wiring film made of an Al film or AlCu film provided on the close contact film. The close contact film is, for example, about 10 nm in thickness. The main wiring film is, for example, about 80 nm in thickness. In the AlCu film, it is preferable for Cu to be, for example, about 1 wt % to about 20 wt %.

In the acoustic wave device 1, each of the first busbar 611 and the second busbar 621 may include a metal film on the main wiring film from the viewpoint of reducing the resistance of the first busbar 611 and the second busbar 621.

(1.3) Manufacturing Method for Acoustic Wave Device

In a non-limiting example of a manufacturing method for the acoustic wave device 1, for example, after the support substrate 2 is prepared, first step to fourth step are performed. In the first step, the acoustic reflection layer 3 is formed on the first principal surface 21 of the support substrate 2. In the second step, a piezoelectric substrate from which the piezoelectric layer 4 is formed and the support substrate 2 are bonded with the acoustic reflection layer 3 interposed therebetween. In the third step, the piezoelectric layer 4 which is a portion of the piezoelectric substrate is formed by thinning the piezoelectric substrate. In the fourth step, the first electrode 51, the second electrode 52, the first wiring portion 61, and the second wiring portion 62 are formed on the piezoelectric layer 4. In the fourth step, the first electrode 51, the second electrode 52, the first wiring portion 61, and the second wiring portion 62 are formed using, for example, a photolithography technique, an etching technique, a thin film forming technique, and the like. In the first step to the fourth step, a silicon wafer is used as the support substrate 2, and a piezoelectric wafer is used as the piezoelectric substrate. In the manufacturing method for the acoustic wave device 1, a wafer including a plurality of the acoustic wave devices 1 is cut with, for example, a dicing machine to obtain the plurality of acoustic wave devices 1 (chips).

The manufacturing method for the acoustic wave device 1 is an example and is not particularly limited. For example, the piezoelectric layer 4 may be formed using a film forming technique. In this case, the manufacturing method for the acoustic wave device 1 includes a step of film-forming the piezoelectric layer 4 instead of the second step and the third step. The piezoelectric layer 4 formed by the film forming technique may be, for example, a single crystal or twin crystal. Examples of the film forming technique include, but are not limited to, a chemical vapor deposition (CVD) method.

(1.4) Operations and Characteristics of Acoustic Wave Device

The acoustic wave device 1 according to Preferred Embodiment 1 utilizes a bulk wave of a thickness-shear primary mode. As described above, the bulk wave of the thickness-shear primary mode is a bulk wave whose propagation direction is in the thickness direction D1 of the piezoelectric layer 4 produced by thickness-shear vibrations of the piezoelectric layer 4, and the number of nodes of the wave is one in the thickness direction D1 of the piezoelectric layer 4. The thickness-shear vibrations are excited by the first electrode 51 and the second electrode 52. The thickness-shear vibrations are excited in the defined region 45 between the first electrode 51 and the second electrode 52 in the piezoelectric layer 4 in a plan view from the thickness direction D1. The thickness-shear vibrations may be confirmed by, for example, a finite element method (FEM). More specifically, the thickness-shear vibrations may be confirmed by, for example, analyzing a displacement distribution by FEM using parameters of the piezoelectric layer 4 (such as, for example, material, Euler angles, and thickness), parameters of the first electrode 51 and the second electrode 52 (such as, for example, material, thickness, and distance between center lines of the first electrode 51 and the second electrode 52), and analyzing distortion. The Euler angles of the piezoelectric layer 4 may be obtained by analysis. In the FEM, for example, Femtet (registered trademark) of Murata Manufacturing Co., Ltd. may be used as analysis simulation software.

Here, a difference between a Lamb wave utilized in an acoustic wave device of the related art and the bulk wave of the thickness-shear primary mode will be described with reference to FIGS. 4A and 4B.

Figure 4A:
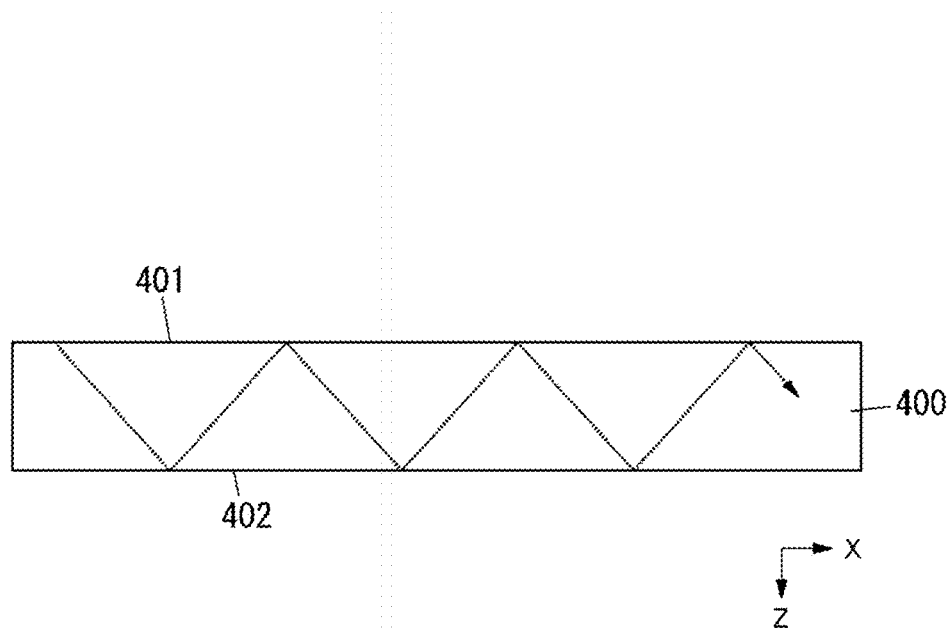
FIG. 4A is an explanatory diagram of a Lamb wave.

FIG. 4A is a schematic elevational cross-sectional view for explaining a Lamb wave propagating through a piezoelectric substrate of an acoustic wave device such as a surface acoustic wave device described in Japanese Unexamined Patent Application Publication No. 2012-257019. In the acoustic wave device of the related art, an acoustic wave propagates through a piezoelectric substrate 400 as indicated by an arrow. In this case, the piezoelectric substrate 400 includes a first principal surface 401 and a second principal surface 402 facing each other. In FIG. 4A, the Z direction and X direction are illustrated in addition to the piezoelectric substrate 400. In FIG. 4A, the Z direction is a thickness direction connecting the first principal surface 401 and the second principal surface 402 of the piezoelectric substrate 400. The X direction is a direction in which a plurality of electrode fingers of the IDT electrode is arranged. The Lamb wave is a plate wave in which an acoustic wave propagates in the X direction as indicated in FIG. 4A. Accordingly, in the acoustic wave device of the related art, because the acoustic wave propagates in the X direction, two reflectors are respectively disposed on both sides of the IDT electrode to obtain desired resonance characteristics. Due to this, in the acoustic wave device of the related art, the propagation loss of the acoustic wave is generated. Therefore, when miniaturization is achieved, that is, when the number of pairs of electrode fingers is reduced, the Q value is reduced.

Figure 4B:
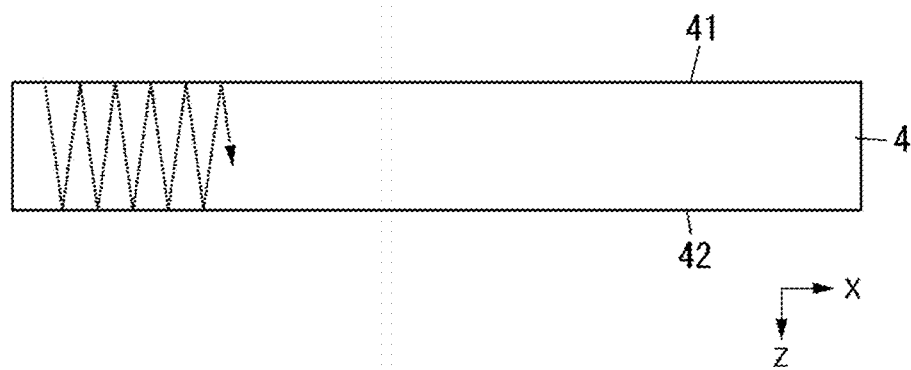
FIG. 4B is an explanatory diagram of a bulk wave of a thickness-shear primary mode.

In contrast, as illustrated in FIG. 4B, in the acoustic wave device 1 according to Preferred Embodiment 1, because the vibration displacement occurs a thickness-shear direction, the acoustic wave propagates in a direction connecting the first principal surface 41 and the second principal surface 42 of the piezoelectric layer 4, that is, propagates in or substantially in the Z direction and resonates. Accordingly, an X-direction component of the acoustic wave is significantly smaller than a Z-direction component thereof. Because resonance characteristics are obtained by the propagation of the acoustic wave in the Z direction, reflectors are not required. This prevents the generation of propagation loss when the acoustic wave propagates to reflectors. Therefore, even when the number of electrode pairs each including the first electrode 51 and the second electrode 52 is reduced in order to achieve miniaturization, the decrease in the Q value is unlikely to occur.

Figure 5:
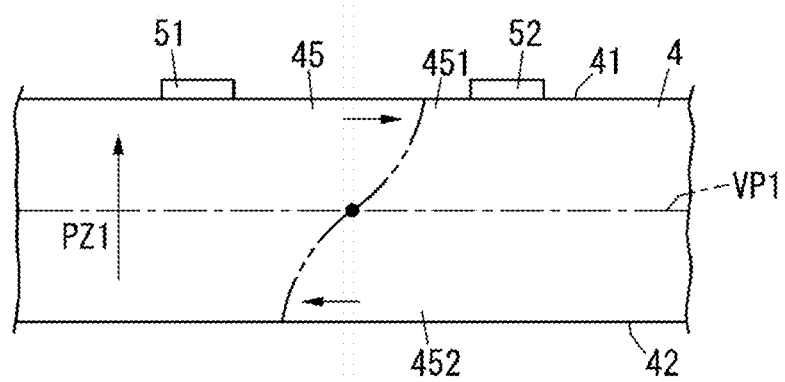
FIG. 5 is an explanatory diagram of operation of the acoustic wave device according to Preferred Embodiment 1 of the present invention.
Figure 6:
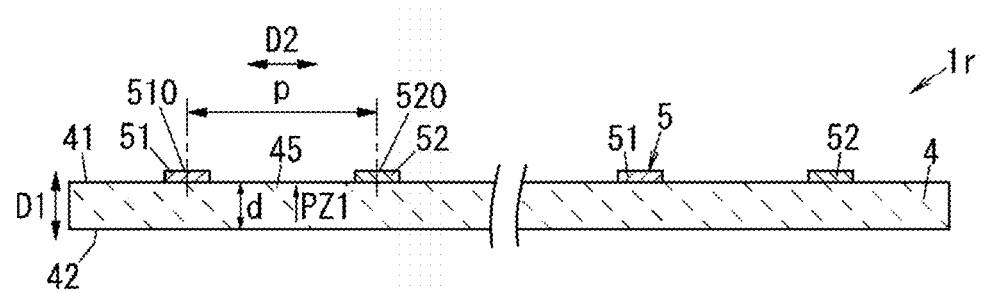
FIG. 6 is an explanatory diagram of a structural model of an acoustic wave device according to a reference configuration.

In the acoustic wave device 1 according to Preferred Embodiment 1, an amplitude direction of the bulk wave of the thickness-shear primary mode in a first region 451 included in the defined region 45 of the piezoelectric layer 4 is opposite to an amplitude direction thereof in a second region 452 included in the defined region 45, as illustrated in FIG. 5. In FIG. 5, a two-dot chain line schematically shows the bulk wave when a voltage to make the second electrode 52 have a higher potential than the first electrode 51 is applied between the first electrode 51 and the second electrode 52. The first region 451 is a portion of the defined region 45 between the first principal surface 41 and a virtual plane VP1 orthogonal or substantially orthogonal to the thickness direction D1 of the piezoelectric layer 4 and dividing the piezoelectric layer 4 into two sections. The second region 452 is a portion of the defined region 45 between the virtual plane VP1 and the second principal surface 42.

Characteristics of a structural model 1r (see FIG. 6) of an acoustic wave device according to a reference configuration utilizing a bulk wave of the thickness-shear primary mode were simulated. Regarding the structural model 1r, the same or corresponding elements as those of the acoustic wave device 1 according to Preferred Embodiment 1 are denoted by the same reference signs, and description thereof will be omitted.

The structural model 1r differs from the acoustic wave device 1 according to Preferred Embodiment 1 in that the first wiring portion 61 and the second wiring portion 62 are not included. In the simulation, the number of pairs of the first electrode 51 and the second electrode 52 was infinite, and the piezoelectric layer 4 was a 120° rotated Y-cut X-propagation LiNbO₃.

In the structural model 1r, the piezoelectric layer 4 is a membrane, and the second principal surface 42 of the piezoelectric layer 4 is in contact with air. In the structural model 1r, in an optional cross section along the thickness direction D1 of the piezoelectric layer 4 (FIG. 6), the distance between the center lines of the first electrode 51 and the second electrode 52 adjacent to each other was denoted as p, and the thickness of the piezoelectric layer 4 was denoted as d. In the structural model 1r, in a plan view from the thickness direction D1 of the piezoelectric layer 4, an area of the first electrode principal portion 510 was denoted as S1, an area of the second electrode principal portion 520 was denoted as S2, an area of the defined region 45 was denoted as S0, and a structural parameter defined by an expression of (S1+S2)/(S1+S2+S0) was denoted as MR. In a case where at least either multiple first electrodes 51 or multiple second electrodes 52 are provided in the piezoelectric layer 4, the distance p between the center lines refers to each distance between the center lines of the first electrode 51 and the second electrode 52 adjacent to each other.

Figure 7A:
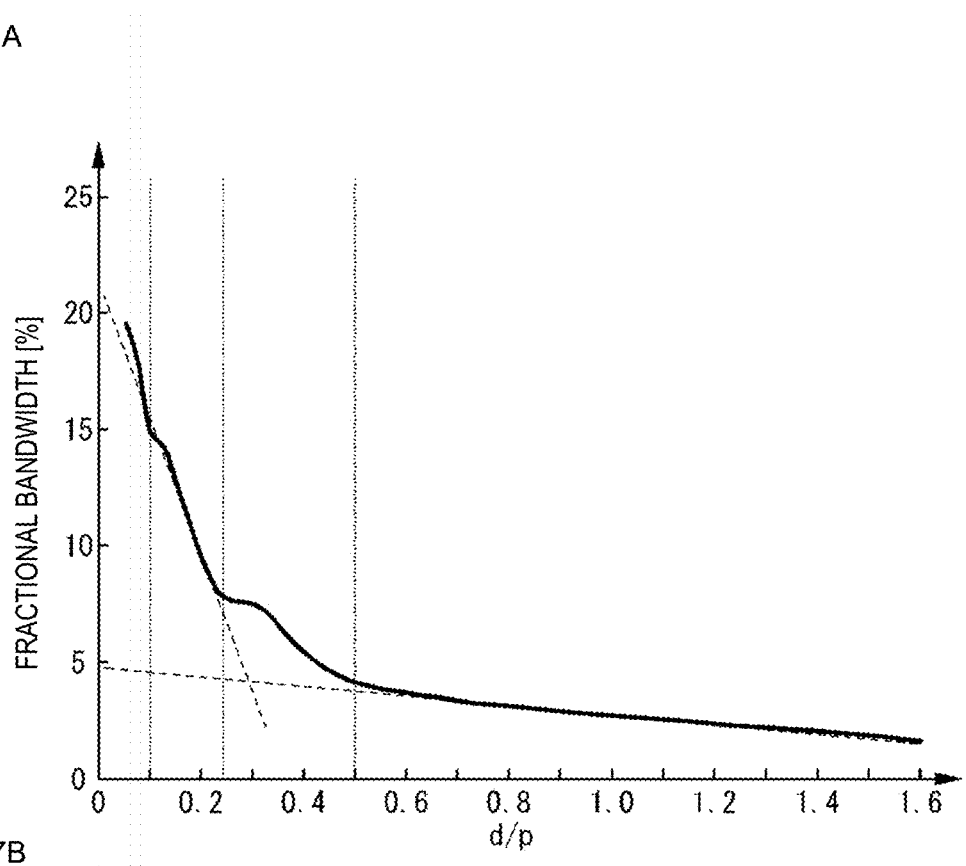
FIG. 7A is a graph showing a relationship between a fractional bandwidth of a thickness-shear mode and an expression of [a thickness of a piezoelectric layer]/[a distance between center lines of a first electrode and a second electrode] with regard to the structural model.
Figure 7B:
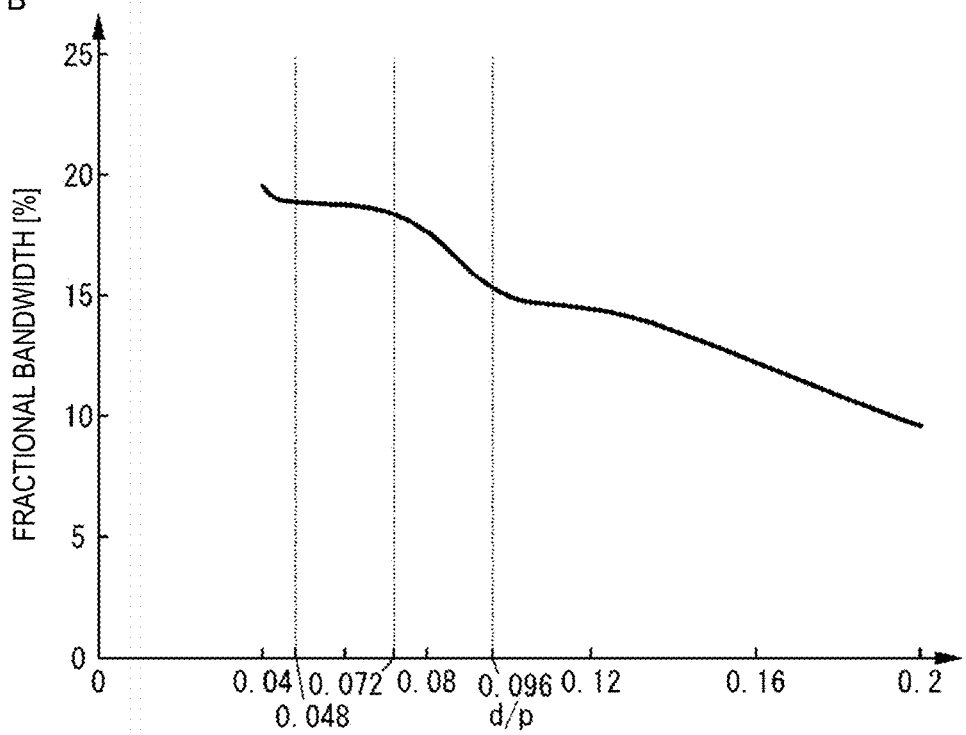
FIG. 7B is a graph showing the relationship between the fractional bandwidth of the thickness-shear mode and an expression of [the thickness of the piezoelectric layer]/[the distance between the center lines of two electrodes forming a pair] with regard to the structural model described above, and is a graph obtained by enlarging a range from 0 to 0.2 on the horizontal axis of FIG. 7A.

FIGS. 7A and 7B are graphs showing a relationship between a fractional bandwidth and d/p when mutually different potentials are applied to the first electrode 51 and the second electrode 52 with regard to the structural model 1r. In each of FIGS. 7A and 7B, the horizontal axis represents d/p and the vertical axis represents the fractional bandwidth. FIGS. 7A and 7B correspond to a case where the piezoelectric layer 4 is a 120° rotated Y-cut X-propagation LiNbO₃, and the same or substantially the same tendency is observed in the cases of other cut-angles. In the structural model 1r of the acoustic wave device, even when the material of the piezoelectric layer 4 is LiTaO₃, the relationship between the fractional bandwidth and d/p has the same or substantially the same tendency as that of FIGS. 7A and 7B. In the structural model 1r of the acoustic wave device, the relationship between the fractional bandwidth and d/p has the same or substantially the same tendency as that of FIGS. 7A and 7B regardless of the number of pairs of the first electrode 51 and the second electrode 52. In the structural model 1r of the acoustic wave device, in addition to the case in which the second principal surface 42 of the piezoelectric layer 4 is in contact with air, in a case in which the second principal surface 42 of the piezoelectric layer 4 is in contact with the acoustic reflection layer 3, the relationship between the fractional bandwidth and d/p has the same or substantially the same tendency as that of FIGS. 7A and 7B.

It may be understood from FIG. 7A that, in the structural model 1r of the acoustic wave device, the value of the fractional bandwidth changes drastically taking a point at d/p=about 0.5 as an inflection point. In the structural model 1r of the acoustic wave device, when d/p is greater than about 0.5, the coupling coefficient is low and the fractional bandwidth is less than about 5% no matter how much d/p is changed within a range of about 0.5<d/p 21 about 1.6. On the other hand, in the structural model 1r of the acoustic wave device, when d/p is less than or equal to about 0.5, it is possible to increase the coupling coefficient and set the fractional bandwidth to be about 5% or more by changing d/p within a range of about 0<d/p about 0.5.

In the structural model 1r of the acoustic wave device, when d/p is less than or equal to about 0.24, it is possible to further increase the coupling coefficient and set the fractional bandwidth to be larger by changing d/p within a range of about 0<d/p≤about 0.24. In the acoustic wave device 1 according to Preferred Embodiment 1, as illustrated in FIG. 2A, in any cross section along the thickness direction D1 of the piezoelectric layer 4, in a case where the distance between the center lines of the first electrode 51 and the second electrode 52 is denoted as p, and the thickness of the piezoelectric layer 4 is denoted as d, the relationship between the fractional bandwidth and d/p has the same or substantially the same tendency as the relationship between the fractional bandwidth and d/p of the structural model 1r of the acoustic wave device.

Furthermore, as is clear from FIG. 7A, when d/p is less than or equal to about 0.10, it is possible to further increase the coupling coefficient and set the fractional bandwidth to be larger by changing d/p within a range of about 0<d/p≤about 0.10.

FIG. 7B is an enlarged graph of a portion of FIG. 7A. As shown in FIG. 7B, the fractional bandwidth changes taking a point at d/p=about 0.096 as an inflection point. Therefore, in a case of d/p≤about 0.096, it is possible to further increase the coupling coefficient and set the fractional bandwidth to be larger than in a case of about 0.096<d/p by changing d/p within a range of about 0<d/p≤about 0.096. Further, as shown in FIG. 7B, the fractional bandwidth changes taking points at d/p=about 0.072 and about 0.048 as inflection points. Therefore, by satisfying a relationship of about 0.048≤d/p≤about 0.072, it is possible to reduce or prevent a change in the coupling coefficient due to a change in d/p and to set the fractional bandwidth to a constant or substantially constant value.

Figure 8:
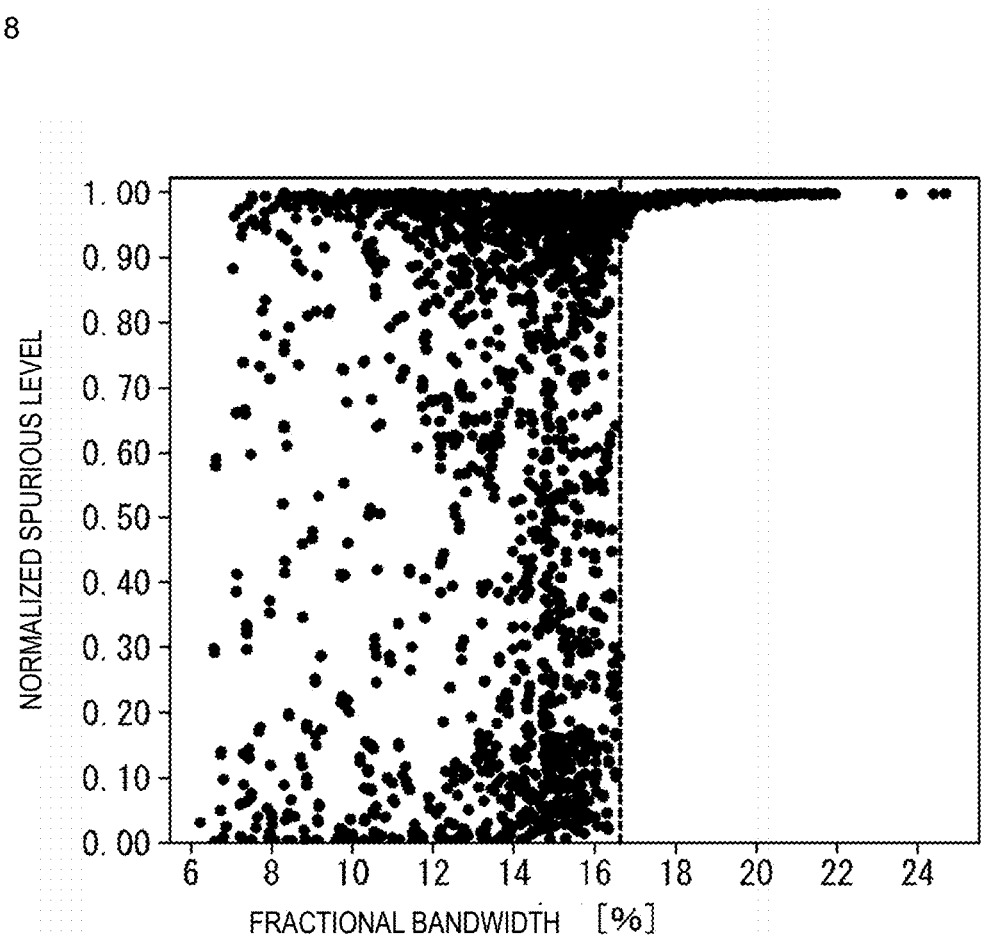
FIG. 8 is a graph showing a relationship between a fractional bandwidth of a thickness-shear mode and a normalized spurious level with regard to the structural model.

FIG. 8 is a graph in which plotted are spurious levels in a frequency band between a resonant frequency and an anti-resonant frequency in a case where the thickness d of the piezoelectric layer 4, the distance p between the center lines of the first electrode 51 and the second electrode 52, the first electrode width H1, and the second electrode width H2 are changed in the structural model 1r of the acoustic wave device according to the reference configuration utilizing the thickness-shear mode. In FIG. 8, the horizontal axis represents the fractional bandwidth and the vertical axis represents the normalized spurious level. The normalized spurious level is a value obtained by normalizing the spurious level in the following manner: a spurious level at a fractional bandwidth (for example, about 22%) where the spurious level has the same or substantially the same value even when the thickness d of the piezoelectric layer 4, the distance p between the center lines of the first electrodes 51 and the second electrodes 52, the first electrode widths H1, and the second electrode widths H2 are changed, is considered to be about 1. FIG. 8 shows a case where a Z-cut LiNbO₃ capable of more suitably exciting the thickness-shear mode is used as the piezoelectric layer 4, and the same or substantially the same tendency is observed in the cases of other cut-angles. In the structural model 1r of the acoustic wave device, even when the material of the piezoelectric layer 4 is LiTaO₃, the relationship between the normalized spurious level and the fractional bandwidth has the same or substantially the same tendency as that of FIG. 8. In the structural model 1r of the acoustic wave device, the relationship between the normalized spurious level and the fractional bandwidth has the same or substantially the same tendency as that of FIG. 8 regardless of the number of pairs of the first electrode 51 and the second electrode 52. In the structural model 1r of the acoustic wave device, in addition to the case in which the second principal surface 42 of the piezoelectric layer 4 is in contact with air, in a case in which the second principal surface 42 of the piezoelectric layer 4 is in contact with the acoustic reflection layer, the relationship between the normalized spurious level and the fractional bandwidth has the same or substantially the same tendency as that of FIG. 8.

Figure 9:
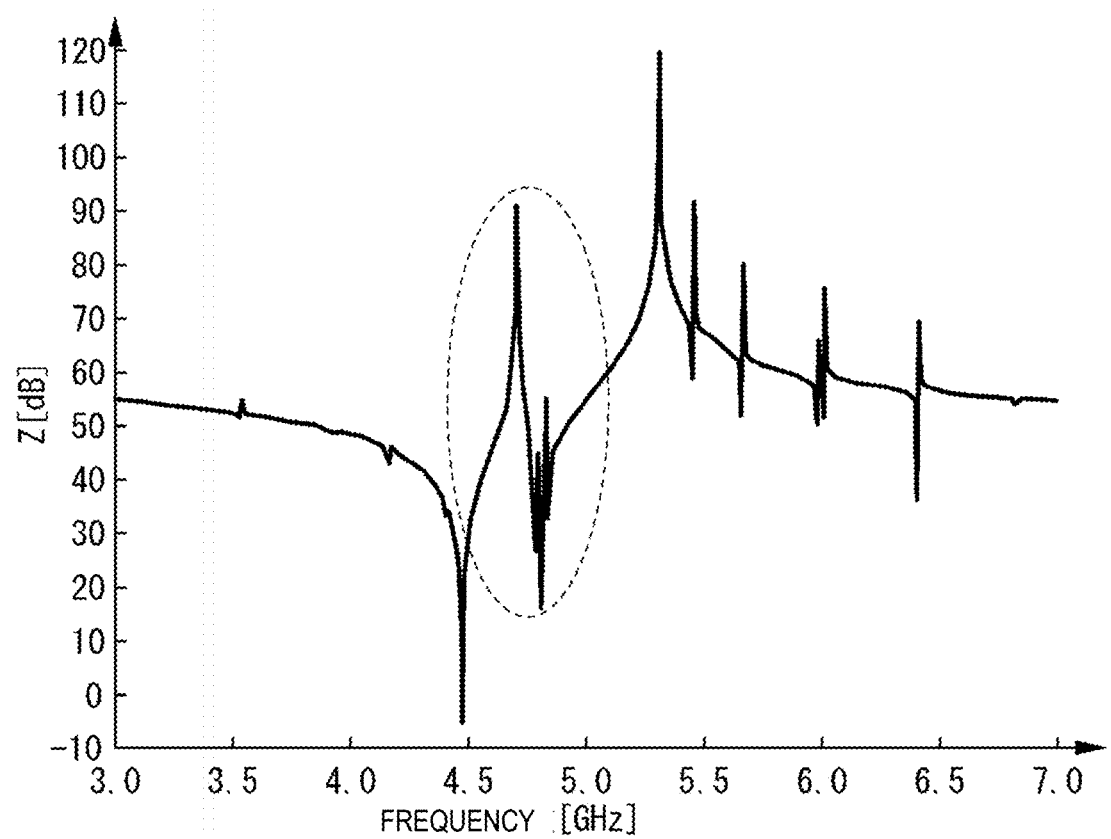
FIG. 9 is a diagram of impedance-frequency characteristics of the structural model.

It may be understood from FIG. 8 that when the fractional bandwidth exceeds about 17%, the normalized spurious level is aggregated to about 1. This indicates that, when the fractional bandwidth is about 17% or more, some sort of sub-resonance exists in a band between the resonant frequency and the anti-resonant frequency as in frequency characteristics of impedance exemplified in FIG. 9. FIG. 9 shows the frequency characteristics of impedance when a Z-cut LiNbO₃ having Euler angles about (0°, 0°, 90°) is used as the piezoelectric layer 4, and d/p equals about 0.08 and MR equals about 0.35. In FIG. 9, a portion of the sub-resonance is surrounded by a broken line.

As described above, in the case where the fractional bandwidth exceeds about 17%, even when the thickness d of the piezoelectric layer 4, the distance p between the center lines of the first electrode 51 and the second electrode 52, the first electrode width H1, and the second electrode width H2 are changed, large spurious signals are included in the band between the resonant frequency and the anti-resonant frequency. Such spurious signals are generated by overtones in a planar direction, mainly in a direction in which the first electrode 51 and the second electrode 52 face each other. Therefore, from the viewpoint of reducing or preventing the spurious signals in the band, the fractional bandwidth is preferably about 17% or less, for example. Because the acoustic wave device 1 according to Preferred Embodiment 1 exhibits the same or substantially the same tendency as that of the structural model 1r of the acoustic wave device with regard to the relationship between the normalized spurious level and the fractional bandwidth, the fractional bandwidth is preferably about 17% or less, for example.

Figure 10:
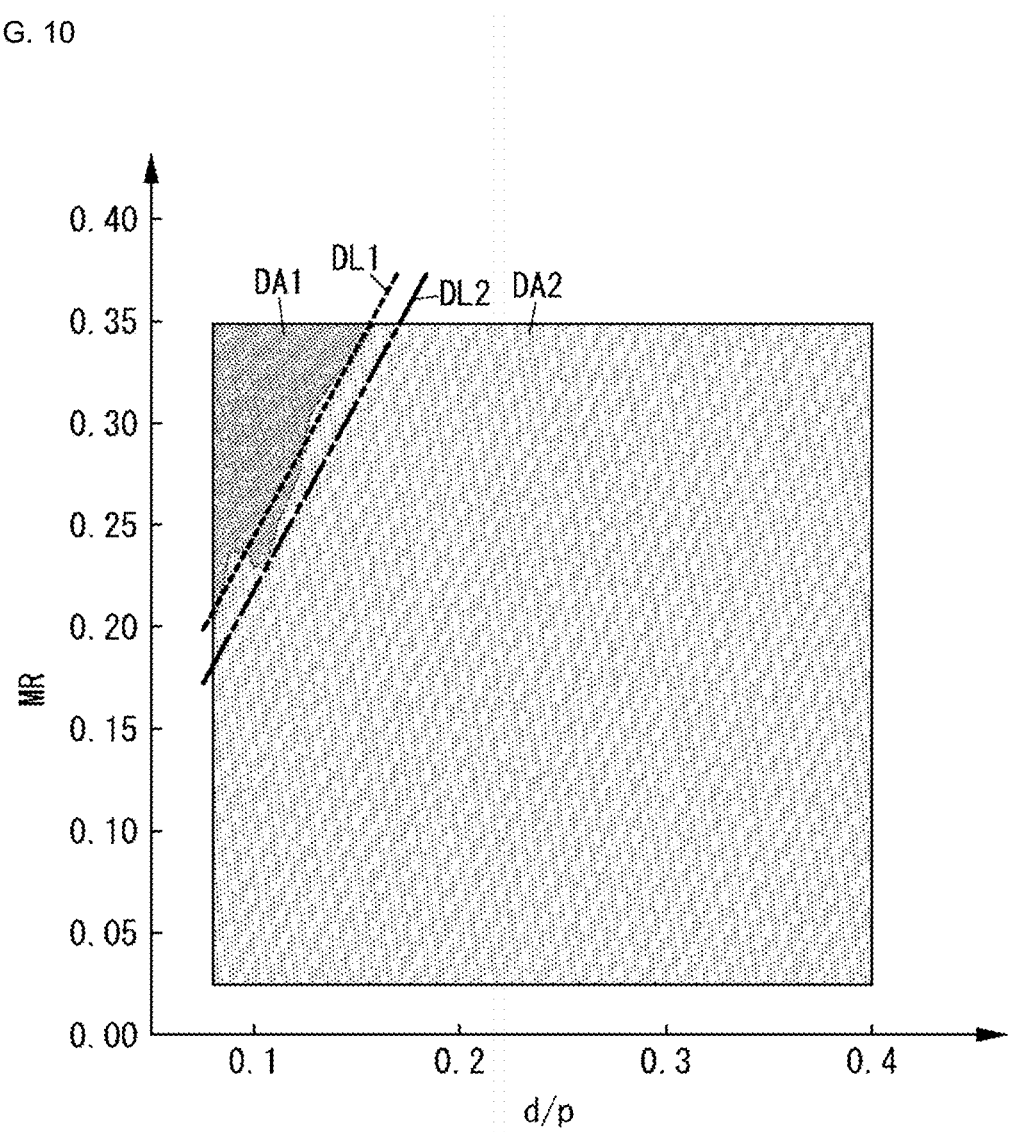
FIG. 10 is a diagram for explaining a fractional bandwidth distribution in a combination of the expression of [the thickness of the piezoelectric layer]/[the distance between the center lines of the first electrode and the second electrode] and a structural parameter with regard to the structural model.

FIG. 10 shows, with regard to the structural model 1r of the acoustic wave device, a first distribution region DA1 with a fractional bandwidth exceeding about 17% and a second distribution region DA2 with a fractional bandwidth not larger than about 17% while considering d/p and MR as parameters, in a case where a Z-cut LiNbO₃ is used as the piezoelectric layer 4, and the thickness d of the piezoelectric layer 4, the distance p between the center lines of the first electrodes 51 and the second electrodes 52, the first electrode width H1, and the second electrode width H2 are changed. In FIG. 10, the first distribution region DA1 and the second distribution region DA2 have different dot densities, and the dot density of the first distribution region DA1 is higher than the dot density of the second distribution region DA2. In FIG. 10, an approximate straight line DL1 of a boundary line between the first distribution region DA1 and the second distribution region DA2 is indicated by a broken line. The approximate straight line DL1 is represented by a numerical expression of MR=1.75×(d/p)+0.075. Accordingly, in the structural model 1r of the acoustic wave device, the fractional bandwidth may be about 17% or less by satisfying a condition of MR 1.75×(d/p)+0.075.

FIG. 10 shows a case where a Z-cut LiNbO₃ capable of more suitably exciting the thickness-shear mode is used as the piezoelectric layer 4, and the same or substantially the same tendency is observed in the cases of other cut-angles. In the structural model 1r of the acoustic wave device, even when the material of the piezoelectric layer 4 is LiTaO₃, the approximate straight line DL1 is the same or substantially the same. In the structural model 1r of the acoustic wave device, the approximate straight line DL1 is the same or substantially the same regardless of the number of pairs of the first electrode 51 and the second electrode 52. In the structural model 1r of the acoustic wave device, in addition to the case in which the second principal surface 42 of the piezoelectric layer 4 is in contact with air, in a case in which the second principal surface 42 of the piezoelectric layer 4 is in contact with the acoustic reflection layer, the approximate straight line DL1 is the same or substantially the same. The acoustic wave device 1 according to Preferred Embodiment 1, similar to the structural model 1r of the acoustic wave device, may cause the fractional bandwidth to be about 17% or less by satisfying the condition of MR≤1.75×(d/p)+0.075. In FIG. 10, an approximate straight line DL2 (hereinafter, also referred to as a second approximate straight line DL2) indicated by a chain line separately from the approximate straight line DL1 (hereinafter, also referred to as the first approximate straight line DL1) is a line indicating a boundary for reliably setting the fractional bandwidth to be about 17% or less. The second approximate straight line DL2 is represented by a numerical expression of MR=1.75×(d/p)+0.05. Accordingly, in the structural model 1r of the acoustic wave device, it is possible to reliably set the fractional bandwidth to be about 17% or less by satisfying a condition of MR=1.75×(d/p)+0.05.

(1.5) Advantageous Effect

The acoustic wave device 1 according to Preferred Embodiment 1 includes the piezoelectric layer 4, the first electrode 51, and the second electrode 52. The first electrode 51 and the second electrode 52 face each other in the direction D2 crossing the thickness direction D1 of the piezoelectric layer 4. The acoustic wave device 1 utilizes a bulk wave of the thickness-shear primary mode. The material of the piezoelectric layer 4 is lithium niobate or lithium tantalate, for example. The first electrode 51 and the second electrode 52 include, for example, the aluminum layers (main electrode films) 511 and 521, respectively, provided on the piezoelectric layer 4. The <111> direction of the crystal of each of the aluminum layers 511 and 521 is a direction orthogonal or substantially orthogonal to the surface on the piezoelectric layer 4 side of each of the aluminum layers 511 and 521.

With the acoustic wave device 1 according to Preferred Embodiment 1, the Q value may be increased and the distortion characteristics may be improved even when the size of the device is reduced. In this case, the acoustic wave device 1 according to Preferred Embodiment 1 utilizes the bulk wave of the thickness-shear primary mode, and resonance characteristics are obtained by the wave propagation in the Z direction. Because of this, reflectors are not required. This prevents the generation of propagation loss when the wave propagates to reflectors. Therefore, even when the number of electrode pairs each including the first electrode 51 and the second electrode 52 is reduced in order to reduce the planar size, the decrease in the Q value is unlikely to occur. In the acoustic wave device 1 according to Preferred Embodiment 1, the <111> direction of the crystal of the aluminum layers (main electrode films) 511 and 521 is orthogonal or substantially orthogonal to the surfaces on the piezoelectric layer 4 side of the aluminum layers 511 and 521. This improves the distortion characteristics when the acoustic wave resonator 5 is excited.

The acoustic wave device 1 according to Preferred Embodiment 1 includes the piezoelectric layer 4, the first electrode 51, and the second electrode 52. The first electrode 51 and the second electrode 52 face each other in the direction D2 crossing the thickness direction D1 of the piezoelectric layer 4. In the acoustic wave device 1, in any cross section along the thickness direction D1 of the piezoelectric layer 4, when the distance between the center line of the first electrode 51 and the center line of the second electrode 52 is denoted as p, and the thickness of the piezoelectric layer 4 is denoted as d, d/p is not greater than about 0.5. The material of the piezoelectric layer 4 is lithium niobate or lithium tantalate, for example. The first electrode 51 and the second electrode 52 include, for example, the aluminum layers (main electrode films) 511 and 521, respectively, provided on the piezoelectric layer 4. The <111> direction of the crystal of each of the aluminum layers 511 and 521 is a direction orthogonal or substantially orthogonal to the surface on the piezoelectric layer 4 side of each of the aluminum layers 511 and 521.

With the acoustic wave device 1 according to Preferred Embodiment 1, the Q value may be increased and the distortion characteristics may be improved even when the size of the device is reduced.

In the acoustic wave device 1 according to Preferred Embodiment 1, the second principal surface 42 of the piezoelectric layer 4 may reduce or prevent unwanted waves by the acoustic reflection layer 3. In the acoustic wave device 1 according to Preferred Embodiment 1, the material of the piezoelectric layer 4 is lithium niobate or lithium tantalate, for example, and the material of the low acoustic impedance layer 31 is, for example, silicon oxide. In this case, the frequency-temperature characteristics of each of the lithium niobate and lithium tantalate have a negative slope, and the frequency-temperature characteristics of the silicon oxide have a positive slope. Thus, in the acoustic wave device 1 according to the preferred embodiment, the absolute value of the temperature coefficient of frequency (TCF) may be reduced, and the frequency-temperature characteristics may be improved.

(1.6) Modifications

Preferred Embodiment 1 discussed above is merely one of various preferred embodiments of the present invention. Preferred Embodiment 1 discussed above may be modified in various ways in accordance with design and the like as long as the advantageous effects of the present invention are obtained.

(1.6.1) Modification 1

Figure 11:
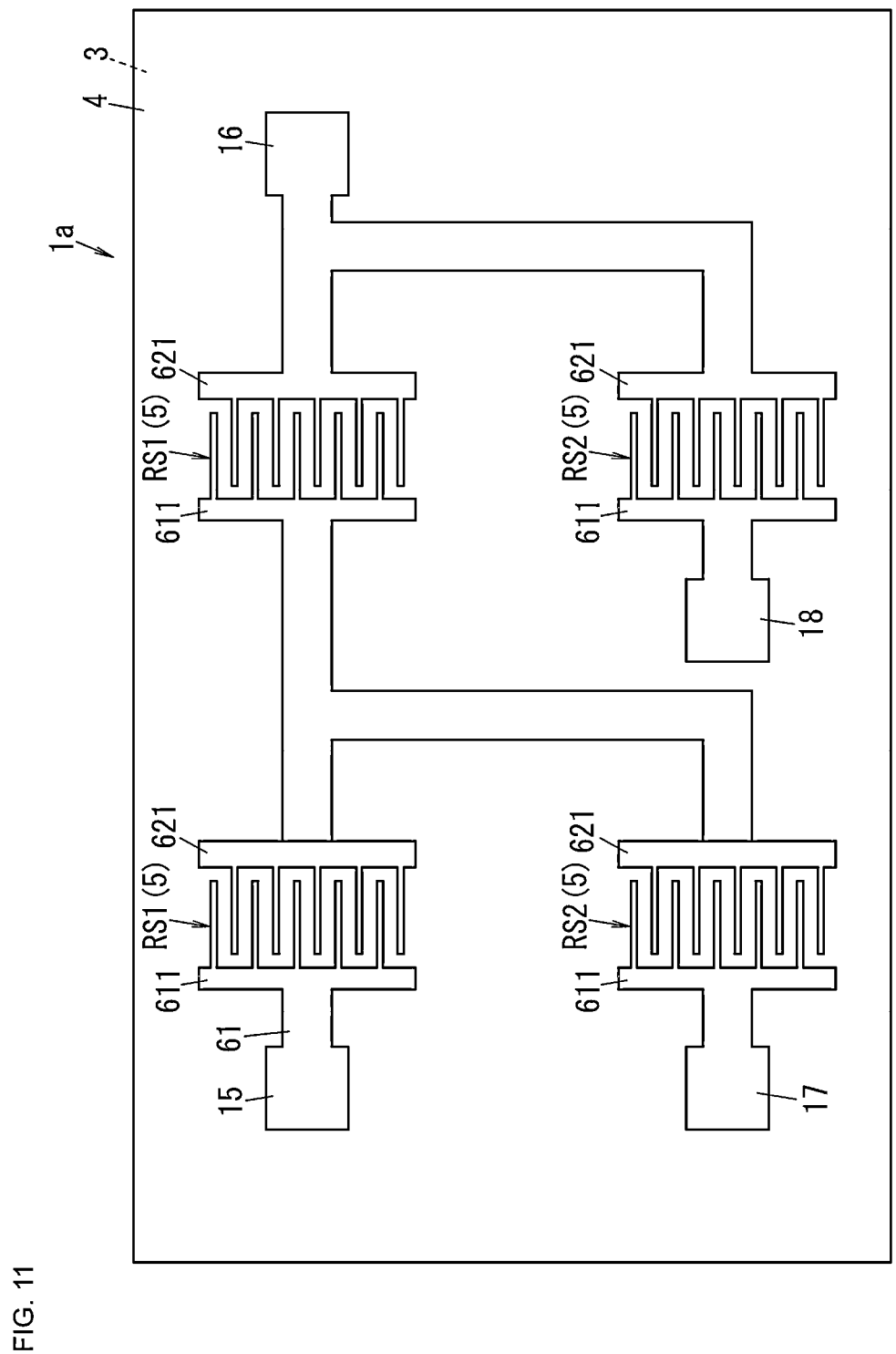
FIG. 11 is a plan view of an acoustic wave device according to Modification 1 of Preferred Embodiment 1 of the present invention.
Figure 12:
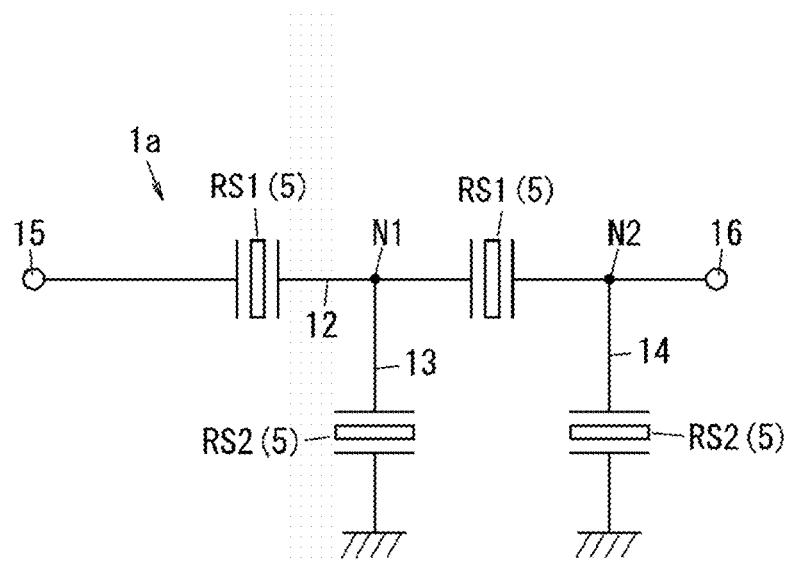
FIG. 12 is an equivalent circuit diagram of the acoustic wave device according to Modification 1 of Preferred Embodiment 1 of the present invention.

Hereinafter, an acoustic wave device 1a according to Modification 1 of a preferred embodiment of the present invention will be described with reference to FIGS. 11 and 12. With regard to the acoustic wave device 1a according to Modification 1, the same or corresponding elements as those of the acoustic wave device 1 according to Preferred Embodiment 1 are denoted by the same reference signs, and description thereof will be omitted.

The acoustic wave device 1a according to Modification 1 is an acoustic wave filter (in this case, a ladder filter). The acoustic wave device 1a includes an input terminal 15, an output terminal 16, a plurality of (for example, two) series-arm resonators RS1 provided on a first path 12 connecting the input terminal 15 and the output terminal 16, and a plurality of (for example, two) parallel-arm resonators RS2 respectively provided on a plurality of (for example, two) second paths, the two second paths include a second path 13 and a second path 14 connecting a plurality of (for example, two) nodes, which are a node N1 and a node N2 on the first path 12, to the ground (ground terminals 17 and 18). The ground terminals 17 and 18 may be configured to be one ground and shared.

In the acoustic wave device 1a, each of the plurality of series-arm resonators RS1 and the plurality of parallel-arm resonators RS2 is the acoustic wave resonator 5. Each of a plurality of the acoustic wave resonators 5 is a resonator including the first electrode 51 and the second electrode 52.

In the acoustic wave device 1a, the piezoelectric layer 4 is shared by the plurality of acoustic wave resonators 5. In the acoustic wave device 1a, the acoustic reflection layer 3 is shared by the plurality of acoustic wave resonators 5. The resonant frequency of the parallel-arm resonator RS2 is lower than that of the series-arm resonator RS1. In this case, the acoustic wave resonator 5 defining the parallel-arm resonator RS2 includes, for example, a silicon oxide film provided on the first principal surface 41 of the piezoelectric layer 4, whereas the acoustic wave resonator 5 defining the series-arm resonator RS1 does not include a silicon oxide film on the first principal surface 41 of the piezoelectric layer 4. The acoustic wave resonator 5 defining the series-arm resonator RS1 may include, for example, a silicon oxide film on the first principal surface 41 of the piezoelectric layer 4. In this case, it is sufficient that the silicon oxide film of the acoustic wave resonator 5 defining the series-arm resonator RS1 is thinner than the silicon oxide film of the acoustic wave resonator 5 defining the parallel-arm resonator RS2.

In the acoustic wave device 1a, the support substrate 2 and the acoustic reflection layer 3 are shared by the plurality of acoustic wave resonators 5. However, of the plurality of high acoustic impedance layers 32, the high acoustic impedance layer 32 (the second high acoustic impedance layer 322) closest to the piezoelectric layer 4 may be isolated for each acoustic wave resonator 5.

(1.6.2) Modification 2

Figure 13:
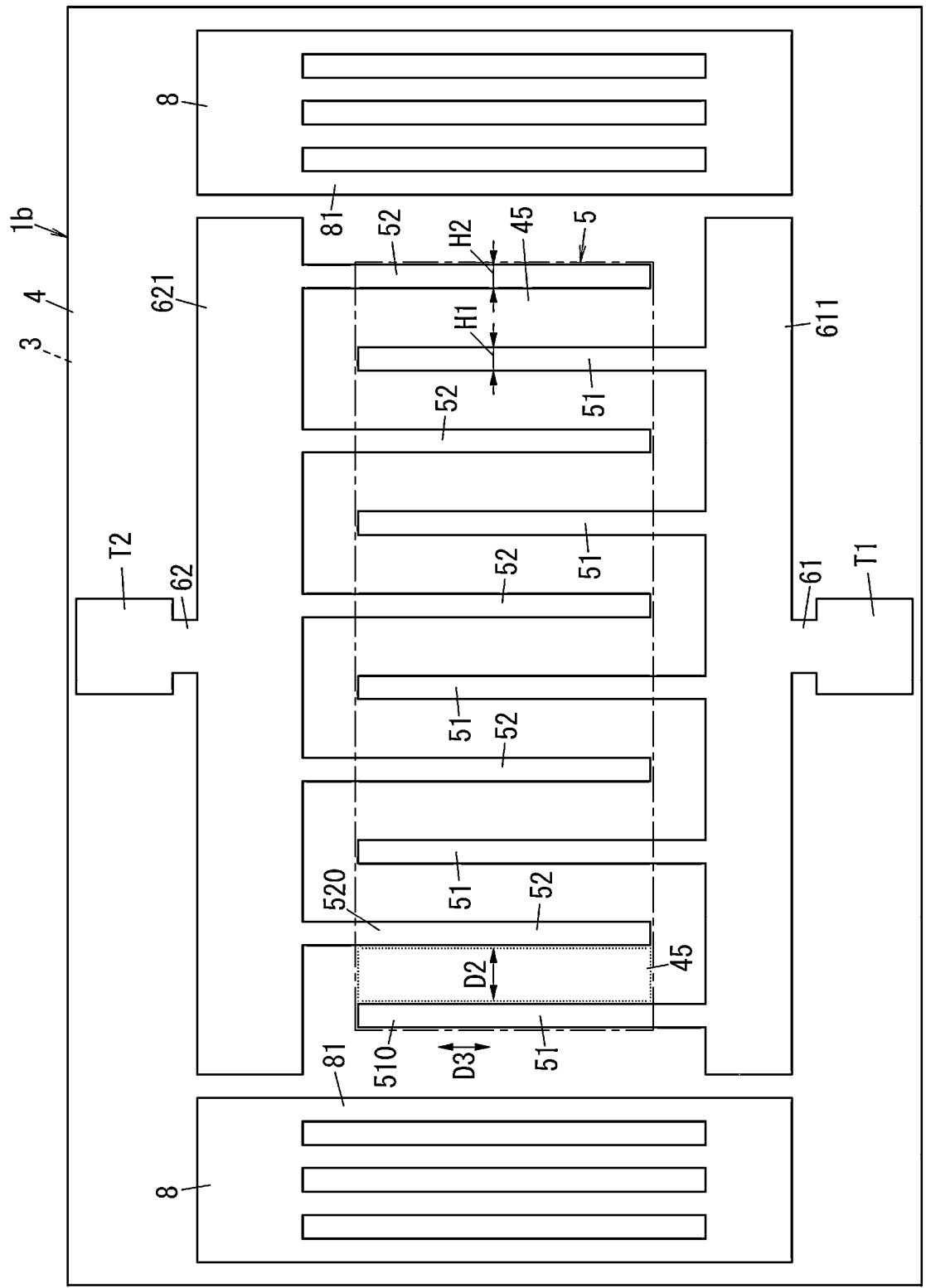
FIG. 13 is a plan view of an acoustic wave device according to Modification 2 of Preferred Embodiment 1 of the present invention.

Hereinafter, an acoustic wave device 1b according to Modification 2 of a preferred embodiment of the present invention will be described with reference to FIG. 13. With regard to the acoustic wave device 1b according to Modification 2, the same or corresponding elements as those of the acoustic wave device 1 according to Preferred Embodiment 1 are denoted by the same reference signs, and description thereof will be omitted.

The acoustic wave device 1b according to Modification 2 differs from the acoustic wave device 1 according to Preferred Embodiment 1 in that two reflectors 8 are provided.

Each of the two reflectors 8 is a short-circuit grating. Each reflector 8 does not reflect a bulk wave of the first-order slip mode but reflects an unwanted surface acoustic wave propagating along the first principal surface 41 of the piezoelectric layer 4. One reflector 8 of the two reflectors 8 is located on the opposite side to the second electrode 52 side of the first electrode 51 located at the end among the plurality of first electrodes 51 in a direction along the propagation direction of the unwanted surface acoustic wave of the acoustic wave device 1b. The remaining one reflector 8 of the two reflectors 8 is located on the opposite side to the first electrode 51 side of the second electrode 52 located at the end among the plurality of second electrodes 52 in the direction along the propagation direction of the unwanted surface acoustic wave of the acoustic wave device 1b.

Each reflector 8 includes a plurality of (for example, four) electrode fingers 81, and one end of each the plurality of electrode fingers 81 is short-circuited to each other and the other end thereof is short-circuited to each other. In each reflector 8, the number of electrode fingers 81 is not particularly limited.

Each reflector 8 is electrically conductive. The material of each of the reflectors 8 is, for example, Al, Cu, Pt, Au, Ag, Ti, Ni, Cr, Mo, W, or an alloy including any of these metals as a main component. Each reflector 8 may include a plurality of metal films made of these metals or alloys that are laminated. Each reflector 8 includes, for example, a laminated film including a close contact film made of a Ti film provided on the piezoelectric layer 4 and a main electrode film made of an Al film provided on the close contact film. The close contact film is, for example, about 10 nm in thickness. The main electrode film is, for example, about 80 nm in thickness.

In the acoustic wave device 1b according to Modification 2, each reflector 8 is a short-circuit grating, but is not limited thereto, and may be, for example, an open grating, a positive-negative reflection grating, or a grating in which a short-circuit grating and an open grating are combined. In the acoustic wave device 1b, two reflectors 8 are provided, but only one of the two reflectors 8 may be provided.

(1.6.3) Modification 3

In the acoustic wave device 1 according to Preferred Embodiment 1, the cross section of each of the first electrode 51 and the second electrode 52 has a rectangular or substantially rectangular shape, but is not limited thereto. For example, the first electrode 51 and the second electrode 52 may have a shape such that the width of a lower end is wider than the width of an upper end as illustrated in any of FIGS. 14A to 14D. This makes it possible to increase capacitance between the first electrode 51 and the second electrode 52 without increasing the width of an upper surface of each of the first electrode 51 and the second electrode 52.

Figure 14A:
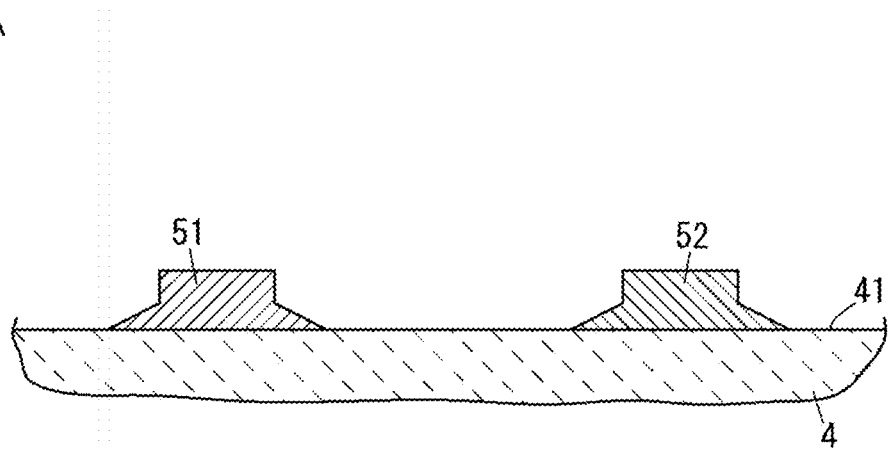
FIGS. 14A to 14D are cross-sectional views illustrating shapes of a first electrode and a second electrode of an acoustic wave device according to Modification 3 of Preferred Embodiment 1 of the present invention.
Figure 14B:
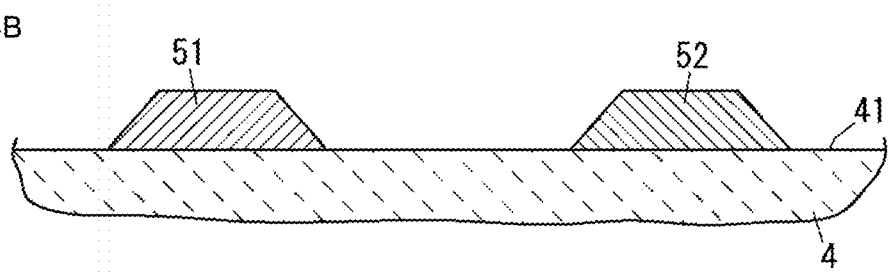
Figure 14C:
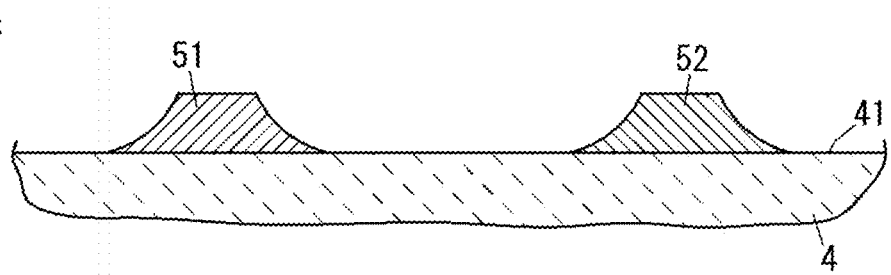
Figure 14D:
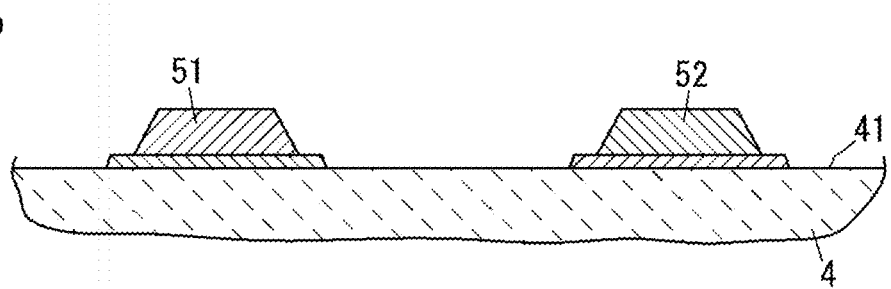

In FIG. 14A, the first electrode 51 and the second electrode 52 include a portion where the width is constant substantially constant on the upper end side and a portion where the width is gradually increased on the lower end side. In FIG. 14B, the first electrode 51 and the second electrode 52 have a trapezoidal or substantially trapezoidal cross-sectional shape. In FIG. 14C, the first electrode 51 and the second electrode 52 have a shape that widens toward the lower end with both side surfaces thereof in the width direction being curved. In FIG. 14D, the first electrode 51 and the second electrode 52 each include a portion with a trapezoidal or substantially trapezoidal cross-sectional shape on the upper end side, and on the lower end side, include a portion with a trapezoidal or substantially trapezoidal cross-sectional shape that is wider in size than the portion with the trapezoidal or substantially trapezoidal cross-sectional shape on the upper end side.

(1.6.4) Modification 4

In the acoustic wave device 1 according to Preferred Embodiment 1, the first principal surface 41 of the piezoelectric layer 4, and the first electrode 51 and the second electrode 52 on the first principal surface 41 are exposed, but are not limited thereto. For example, as illustrated in any of FIGS. 15A to 15C, the acoustic wave device 1 may include a dielectric film 9 covering the first principal surface 41 of the piezoelectric layer 4, and the first electrode 51 and second electrode 52 on the first principal surface 41.

Figure 15A:
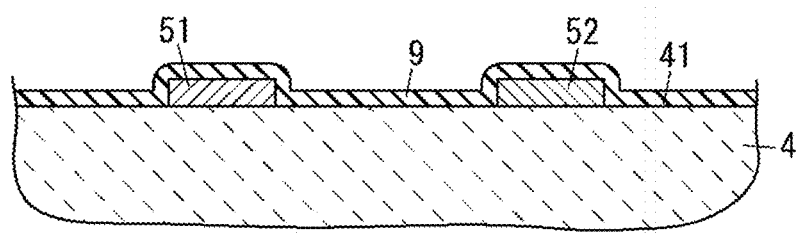
FIGS. 15A to 15C are cross-sectional views each illustrating a configuration example of an acoustic wave device according to Modification 4 of Preferred Embodiment 1 of the present invention.
Figure 15B:
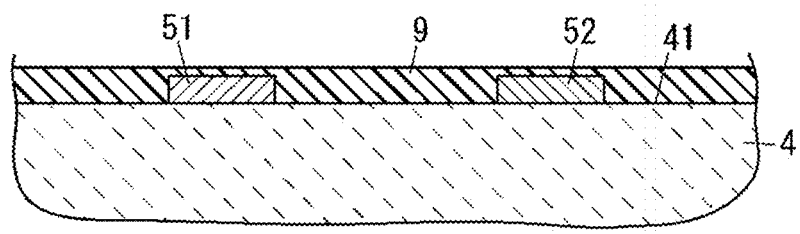
Figure 15C:
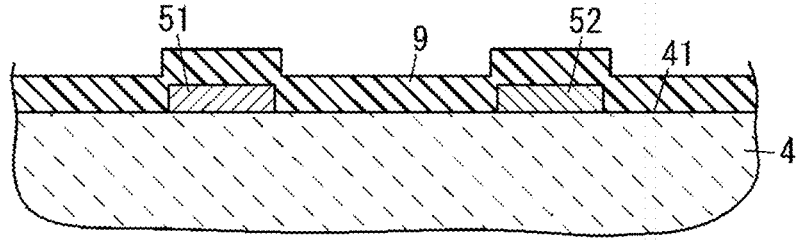

In FIG. 15A, the dielectric film 9 is thinner than the first electrode 51 and the second electrode 52, and the surface of the dielectric film 9 has a concavo-convex shape along the shape of the base material. In FIG. 15B, the surface of the dielectric films 9 is flattened to have a planar shape. In FIG. 15C, the dielectric film 9 is thicker than the first electrode 51 and the second electrode 52, and the surface of the dielectric film 9 has a concavo-convex shape along the shape of the base material.

(1.6.5) Other Modifications

In Preferred Embodiment 1, the first electrode 51 and the second electrode 52 are provided on the first principal surface 41 of the piezoelectric layer 4, but is not limited thereto. The first electrode 51 and the second electrode 52 may be provided on the second principal surface 42 of the piezoelectric layer 4. That is, the first electrode 51 and the second electrode 52 may be provided on the principal surface (in this case, the second principal surface 42) of the piezoelectric layer 4 and may face each other on this principal surface.

In Preferred Embodiment 1, the first electrode 51 and the second electrode 52 are provided on the first principal surface 41 of the piezoelectric layer 4, but is not limited thereto. At least a portion of each of the first electrode 51 and the second electrode 52 may be buried in the piezoelectric layer 4.

In Preferred Embodiment 1, the cross-sectional shape of the first electrode 51 and the cross-sectional shape of the second electrode 52 are the same or substantially the same, but the cross-sectional shape of the first electrode 51 and the cross-sectional shape of the second electrode 52 may be different. In this case, the cross-sectional shape is, for example, a shape of a cross section orthogonal or substantially orthogonal to the thickness direction D1 and the second direction D2 of the piezoelectric layer 4.

When an acoustic wave filter is configured as in the acoustic wave device 1a of Modification 1 of Preferred Embodiment 1, the shapes of the first electrode 51 and the second electrode 52 may be different for each acoustic wave resonator 5. The shapes of the first electrode 51 and the second electrode 52 may be different between the acoustic wave resonator 5 defining the series-arm resonator RS1 and the acoustic wave resonator 5 defining the parallel-arm resonator RS2.

In Preferred Embodiment 1, the first electrode 51 and the second electrode 52 have a linear shape in a plan view from the thickness direction D1 of the piezoelectric layer 4, but are not limited thereto. The first electrode 51 and the second electrode 52 may have, for example, a curved shape, or a shape including a linear portion and a curved portion.

Instead of the acoustic wave resonator 5 in the acoustic wave device 1a according to Modification 1 of Preferred Embodiment 1, any of the acoustic wave resonators 5 according to Modifications 2 to 4 of Preferred Embodiment 1, an acoustic wave resonator 5 of Preferred Embodiment 2 described below, and an acoustic wave resonator 5 according to Modification 1 of Preferred Embodiment 2 described below may be provided.

In Preferred Embodiment 1, each of the first electrode 51 and the second electrode 52 includes the main electrode films 511, 521 and the close contact films 512, 522, but the close contact films 512, 522 may be omitted. In other words, the first electrode 51 and the second electrode 52 may include only the main electrode films 511 and 521, respectively.

In Preferred Embodiment 1, the close contact layer (close contact films 512, 522) includes one layer, but the close contact layer may include two or more layers. As an example, a case in which the close contact layer includes two layers may be provided. In this case, for example, when one of the two close contact layers is a Ti film and the other one thereof is a NiCr film, it is preferable that the piezoelectric layer 4, the Ti film, the NiCr film, and the main electrode films 511, 521 are laminated in this order.

Another metal film may be provided on the main electrode films 511, 521. As an example, the metal film may be a Ti film. In this case, it is sufficient that, for example, the piezoelectric layer 4, the Ti film as a close contact layer, the main electrode films 511, 521, and the Ti film as another metal film are laminated in this order.

In Preferred Embodiment 1, the thickness of each of the plurality of first electrodes 51 is smaller than the thickness of the piezoelectric layer 4, but the thickness of each of the plurality of first electrodes 51 may be equal or substantially equal to the thickness of the piezoelectric layer 4 or larger than the thickness of the piezoelectric layer 4.

Modifications 1 to 4 and the other modifications described above may also be applied to acoustic wave devices 1c and 1d according to Preferred Embodiment 2 described below.

Preferred Embodiment 2

Figure 16:
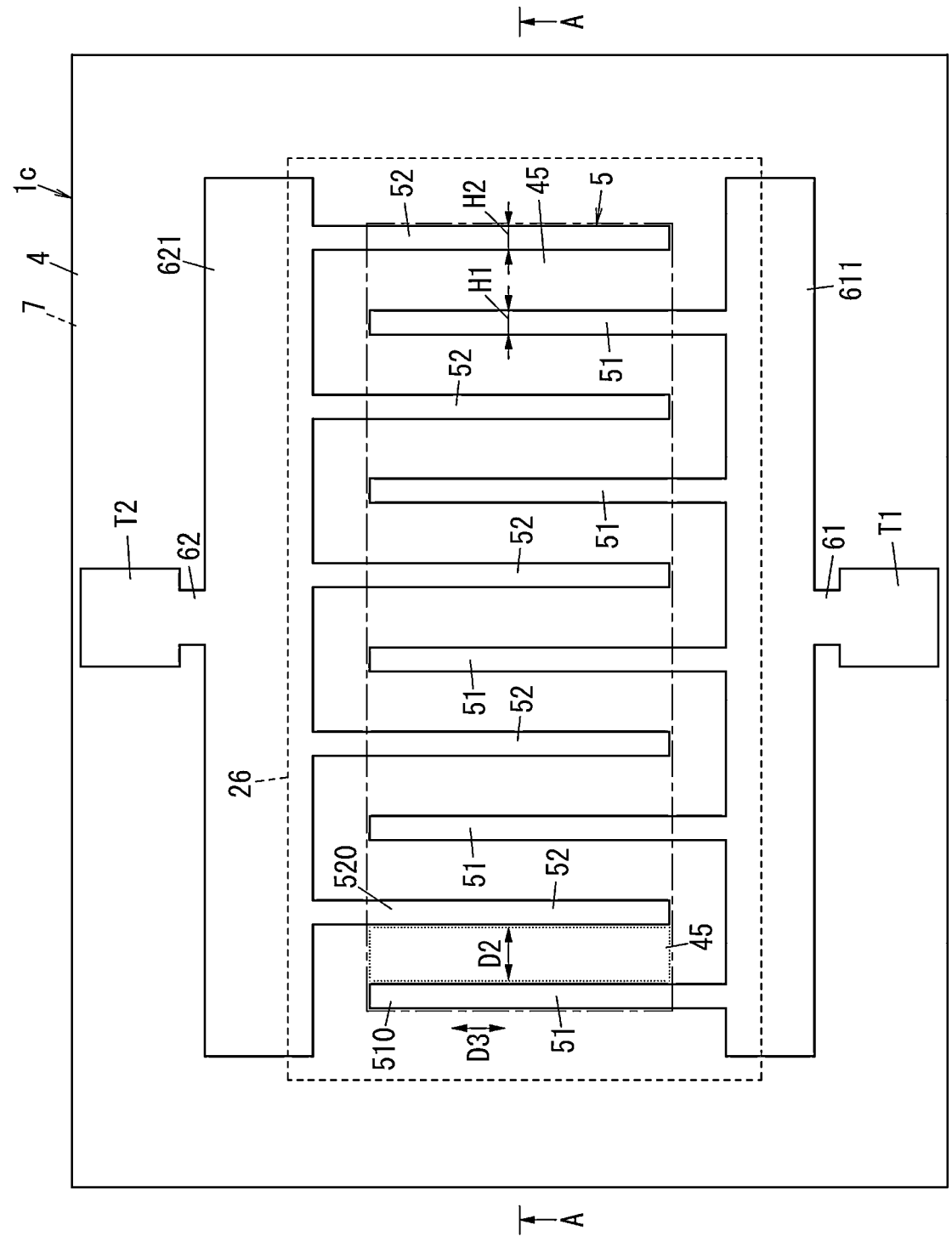
FIG. 16 is a plan view of an acoustic wave device according to Preferred Embodiment 2 of the present invention.
Figure 17:
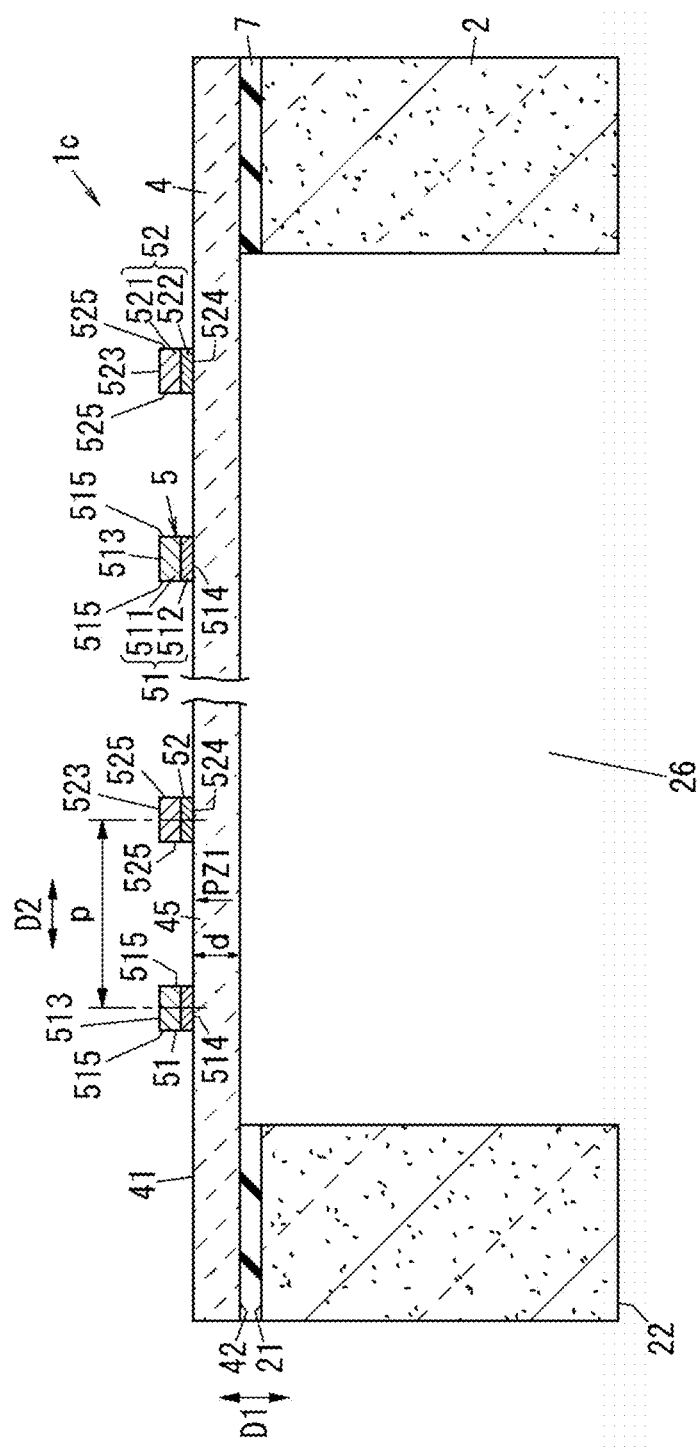
FIG. 17 is a cross-sectional view of the acoustic wave device taken along a line A-A in FIG. 16.

Hereinafter, the acoustic wave device 1c according to Preferred Embodiment 2 of the present invention will be described with reference to FIGS. 16 and 17. With regard to the acoustic wave device 1c according to Preferred Embodiment 2, the same or corresponding elements as those of the acoustic wave device 1 according to Preferred Embodiment 1 are denoted by the same reference signs, and description thereof will be omitted.

(2.1) Configuration of Acoustic Wave Device

The acoustic wave device 1c according to Preferred Embodiment 2 does not include the acoustic reflection layer 3 of the acoustic wave device 1 according to Preferred Embodiment 1. In the acoustic wave device 1c according to Preferred Embodiment 2, the piezoelectric layer 4 is provided on the support substrate 2. In this case, the support substrate 2 is, for example, a silicon substrate. The piezoelectric layer 4 is bonded to the support substrate 2 with, for example, a silicon oxide film 7 interposed therebetween. The acoustic wave device 1c further includes a cavity 26. The cavity 26 is located immediately below the acoustic wave resonator 5. That is, the cavity 26 is provided on the side opposite to the resonator 5 across the piezoelectric layer. The acoustic wave resonator 5 includes the first electrode 51 and the second electrode 52 in a plan view from the thickness direction D1 of the piezoelectric layer 4, and a portion (defined region 45) between the first electrode 51 and the second electrode 52 in the piezoelectric layer 4 in the plan view from the thickness direction D1 of the piezoelectric layer 4. In the acoustic wave device 1c according to Preferred Embodiment 2, the cavity 26 is extends through the support substrate 2 and the silicon oxide film 7, and exposes a portion of the piezoelectric layer 4 (a portion of the second principal surface 42). In the acoustic wave device 1c according to Preferred Embodiment 2, the acoustic wave resonator 5 does not include the acoustic reflection layer 3 of the acoustic wave device 1 according to Preferred Embodiment 1. The cavity 26 overlaps a portion of each of the first wiring portion 61 and the second wiring portion 62 in the plan view from the thickness direction D1 of the piezoelectric layer 4. It is not necessary for the cavity 26 to overlap a portion of each of the first wiring portion 61 and the second wiring portion 62 in the plan view from the thickness direction D1 of the piezoelectric layer 4.

The thickness of the support substrate 2 is, for example, in a range from about 50 μm to about 500 μm. The thickness of the silicon oxide film 7 is, for example, in a range from about 0.01 μm to about 10 μm. The piezoelectric layer 4 has the same thickness as the piezoelectric layer 4 of the acoustic wave device 1 according to Preferred Embodiment 1.

(2.2) Manufacturing Method for Acoustic Wave Device

In a non-limiting example of a manufacturing method for the acoustic wave device 1c, for example, after the support substrate 2 is prepared, first step to fifth step are performed. In the first step, the silicon oxide film 7 is formed on the first principal surface 21 of the support substrate 2. In the second step, a piezoelectric substrate from which the piezoelectric layer 4 is formed and the support substrate 2 are bonded with the silicon oxide film 7 interposed therebetween. In the third step, the piezoelectric layer 4 made of a portion of the piezoelectric substrate is formed by thinning the piezoelectric substrate. In the fourth step, the plurality of first electrodes 51, the plurality of second electrodes 52, the first wiring portion 61, and the second wiring portion 62 are formed on the piezoelectric layer 4. In the fifth step, the cavity 26 is formed. In the fourth step, the plurality of first electrodes 51, the plurality of second electrodes 52, the first wiring portion 61, and the second wiring portion 62 are formed using, for example, a photolithography technique, an etching technique, a thin film forming technique, and the like. In the fifth step, a region where the cavity 26 is expected to be formed in the support substrate 2 and the silicon oxide film is etched using, for example, a photolithography technique, an etching technique, and the like. In the fifth step, etching is performed using the silicon oxide film 7 as an etching stopper layer, and then an unnecessary portion of the silicon oxide film 7 is removed by, for example, etching so as to expose a portion of the second principal surface 42 of the piezoelectric layer 4. In the first step to the fifth step, a silicon wafer is used as the support substrate 2, and a piezoelectric wafer is used as the piezoelectric substrate. In the manufacturing method for the acoustic wave device 1*c*, a wafer including a plurality of the acoustic wave devices 1*c* is cut with, for example, a dicing machine to obtain the plurality of acoustic wave devices 1*c* (chips).

The manufacturing method for the acoustic wave device 1*c* is an example and is not particularly limited. For example, the piezoelectric layer 4 may be formed using a film forming technique. In this case, the manufacturing method for the acoustic wave device 1*c* includes a step of film-forming the piezoelectric layer 4 instead of the second step and the third step. The piezoelectric layer 4 formed by the film forming technique may be, for example, a single crystal or a twin crystal. Examples of the film forming technique include, but are not limited to, a CVD method.

(2.3) Advantageous Effects

The acoustic wave device 1*c* according to Preferred Embodiment 2, similar to the acoustic wave device 1 according to Preferred Embodiment 1, includes the piezoelectric layer 4, the first electrode 51, and the second electrode 52. The first electrode 51 and the second electrode 52 face each other in the direction D2 crossing the thickness direction D1 of the piezoelectric layer 4. The acoustic wave device 1*c* utilizes a bulk wave of the thickness-shear primary mode. The material of the piezoelectric layer 4 is, for example, lithium niobate or lithium tantalate. The first electrode 51 and the second electrode 52 include, for example, the aluminum layers 511 and 521, respectively, provided on the piezoelectric layer 4. The <111> direction of the crystal of each of the aluminum layers 511 and 521 is a direction orthogonal or substantially orthogonal to the surface on the piezoelectric layer 4 side of each of the aluminum layers 511 and 521. With the configuration described above, in the acoustic wave device 1*c* according to Preferred Embodiment 2, the Q value may be increased and the distortion characteristics may be improved even when the size of the device is reduced.

The acoustic wave device 1*c* according to Preferred Embodiment 2, similar to the acoustic wave device 1 according to Preferred Embodiment 1, includes the piezoelectric layer 4, the first electrode 51, and the second electrode 52. The first electrode 51 and the second electrode 52 face each other in the direction D2 crossing the thickness direction D1 of the piezoelectric layer 4. In the acoustic wave device 1*c*, in any cross section along the thickness direction D1 of the piezoelectric layer 4, when the distance between the center line of the first electrode 51 and the center line of the second electrode 52 is denoted as p, and the thickness of the piezoelectric layer 4 is denoted as d, d/p is not greater than about 0.5. The material of the piezoelectric layer 4 is, for example, lithium niobate or lithium tantalate. The first electrode 51 and the second electrode 52 include, for example, the aluminum layers 511 and 521, respectively, provided on the piezoelectric layer 4. The <111> direction of the crystal of each of the aluminum layers 511 and 521 is a direction orthogonal or substantially orthogonal to the surface on the piezoelectric layer 4 side of each of the aluminum layers 511 and 521. With the configuration described above, in the acoustic wave device 1*c* according to Preferred Embodiment 2, the Q value may be increased and the distortion characteristics may be improved even when the size of the device is reduced.

The acoustic wave device 1*c* according to Preferred Embodiment 2 includes the cavity 26, such that the energy of the bulk wave is confined in the piezoelectric layer 4 and an improved Q value may be obtained.

In the acoustic wave device 1*c* according to Preferred Embodiment 2, the piezoelectric layer 4 is bonded to the support substrate 2 with the silicon oxide film 7 interposed therebetween, but the silicon oxide film 7 is not a necessary element. In addition to the silicon oxide film 7, another layer may be laminated between the support substrate 2 and the piezoelectric layer 4. In the acoustic wave device 1*c* according to Preferred Embodiment 2, the cavity 26 passes through the support substrate 2 in the thickness direction thereof, but is not limited thereto. The cavity 26 does not pass through the support substrate 2, and may be defined by an internal space of a recess provided in the first principal surface 21 of the support substrate 2. The acoustic wave resonator 5 may include another film (for example, a dielectric film such as the silicon oxide film 7) laminated on the second principal surface 42 of the piezoelectric layer 4.

(2.4) Modifications

Preferred Embodiment 2 is merely one of various preferred embodiments of the present invention. Preferred Embodiment 2 may be modified in various ways in accordance with design and the like as long as the advantageous effects of the present invention are obtained.

(2.4.1) Modification 1

Figure 18:
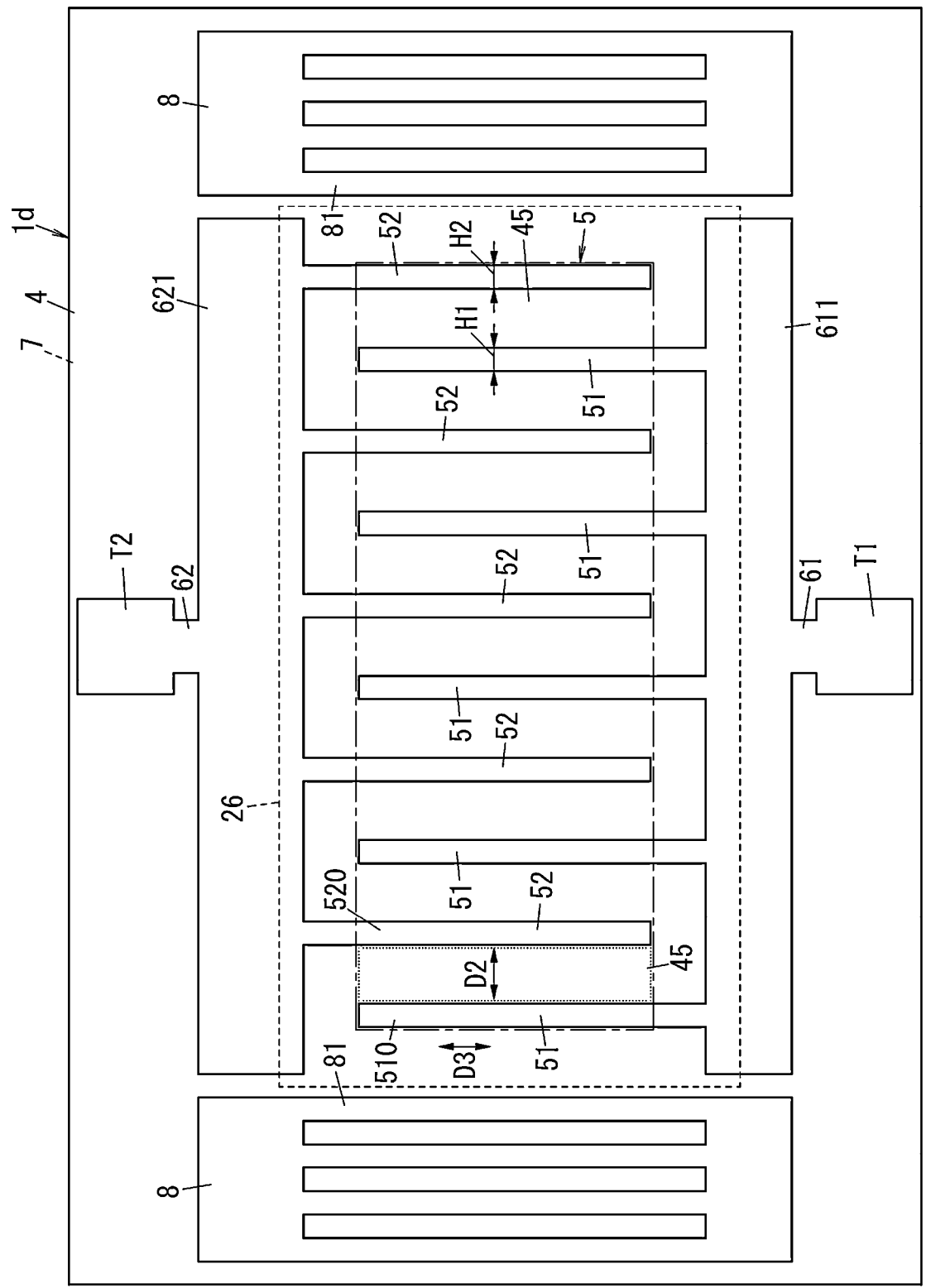
FIG. 18 is a plan view of an acoustic wave device according to Modification 1 of Preferred Embodiment 2 of the present invention.

Hereinafter, the acoustic wave device 1*d* according to Modification 1 of Preferred Embodiment 2 will be described with reference to FIG. 18. With regard to the acoustic wave device 1*d* according to Modification 1 of Preferred Embodiment 2, the same or corresponding elements as those of the acoustic wave device 1*c* according to Preferred Embodiment 2 are denoted by the same reference signs, and description thereof will be omitted.

The acoustic wave device 1*d* according to Modification 1 of Preferred Embodiment 2 differs from the acoustic wave device 1*c* according to Preferred Embodiment 2 in that two reflectors 8 are included as in the acoustic wave device 1*b* according to Modification 2 of Preferred Embodiment 1. The configuration of each reflector 8 is the same as or similar to that of each reflector 8 of the acoustic wave device 1*b*.

(2.4.2) Other Modifications

Modifications 1 to 4 and the other modifications of Preferred Embodiment 1 described above may be applied to the acoustic wave device 1*c* according to Preferred Embodiment 2 and the acoustic wave device 1*d* according to Modification 1.

The following preferred embodiments of the present invention are disclosed in the present specification based on the above-described preferred embodiments and the like.

An acoustic wave device (1; 1a; 1b; 1c; 1d) according to a preferred embodiment of the present invention includes the piezoelectric layer (4), the first electrode (51), and the second electrode (52). The first electrode (51) and the second electrode (52) face each other in the direction (D2) crossing the thickness direction (D1) of the piezoelectric layer (4). The first electrode (51) and the second electrode (52) are adjacent to each other. The acoustic wave device (1; 1a; 1b; 1c; 1d) utilizes a bulk wave of the thickness-shear primary mode. The material of the piezoelectric layer (4) is lithium niobate or lithium tantalate. The first electrode (51) and the second electrode (52) include the aluminum layers (511 and 521), respectively, on the piezoelectric layer (4). The orientation direction of the crystal of each of the aluminum layers (511 and 521) is a direction orthogonal or substantially orthogonal to the surface on the piezoelectric layer (4) side of each of the aluminum layers (511 and 521).

According to the above-described preferred embodiment, it is possible to increase the Q value and improve the distortion characteristics even when the size of the device is reduced.

An acoustic wave device (1; 1a; 1b; 1c; 1d) according to a preferred embodiment of the present invention includes the piezoelectric layer (4), the first electrode (51), and the second electrode (52). The first electrode (51) and the second electrode (52) face each other in the direction (D2) crossing the thickness direction (D1) of the piezoelectric layer (4). In the acoustic wave device (1; 1a; 1b; 1c; 1d), when the distance between the center line of the first electrode (51) and the center line of the second electrode (52) is denoted as p, and the thickness of the piezoelectric layer (4) is denoted as d, d/p is not greater than about 0.5 in any cross section along the thickness direction (D1). The material of the piezoelectric layer (4) is lithium niobate or lithium tantalate. The first electrode (51) and the second electrode (52) include the aluminum layers (511 and 521), respectively, on the piezoelectric layer (4). The orientation direction of the crystal of each of the aluminum layers (511 and 521) is a direction orthogonal or substantially orthogonal to the surface on the piezoelectric layer (4) side of each of the aluminum layers (511 and 521).

According to the above-described preferred embodiment, it is possible to increase the Q value and improve the distortion characteristics even when the size of the device is reduced.

In an acoustic wave device (1; 1a; 1b; 1c; 1d) according to a preferred embodiment of the present invention, the first electrode (51) and the second electrode (52) face each other on the principal surface (for example, the first principal surface 41) of the piezoelectric layer (4).

In an acoustic wave device (1; 1a; 1b; 1c; 1d) according to a preferred embodiment of the present invention, an orientation direction is orthogonal or substantially orthogonal to a principal surface (for example, the first principal surface 41) of the piezoelectric layer (4).

According to the above-described preferred embodiment, it is possible to increase the Q value and improve the distortion characteristics even when the size of the device is reduced.

In an acoustic wave device (1; 1a; 1b; 1c; 1d) according to a preferred embodiment of the present invention, the aluminum layers (511 and 521) are epitaxial layers.

According to the above-described preferred embodiment, it is possible to increase the Q value and improve the distortion characteristics even when the size of the device is reduced.

In an acoustic wave device (1; 1a; 1b; 1c; 1d) according to a preferred embodiment of the present invention, Euler angles ($\varphi$, $\theta$, $\psi$) of the piezoelectric layer (4) are about (0°±10°, 0°±10°, $\psi$).

According to the above-described preferred embodiment, it is possible to increase the Q value and improve the distortion characteristics even when the size of the device is reduced.

In an acoustic wave device (1; 1a; 1b; 1c; 1d) according to a preferred embodiment of the present invention, d/p is equal to or less than about 0.24.

According to the above-described preferred embodiment, it is possible to further increase the fractional bandwidth.

In an acoustic wave device (1; 1a; 1b; 1c; 1d) according to a preferred embodiment of the present invention, the first electrode (51) and the second electrode (52) are adjacent to each other. The first electrode (51) includes the first electrode principal portion (510) intersecting with the second electrode (52) in a direction in which the first electrode (51) and the second electrode (52) face each other. The second electrode (52) includes the second electrode principal portion (520) intersecting with the first electrode (51) in the direction in which the first electrode (51) and the second electrode (52) face each other. In a plan view from the thickness direction (D1), the piezoelectric layer (4) includes the defined region (45) intersecting with both the first electrode (51) and the second electrode (52) in a direction in which the first electrode (51) and the second electrode (52) face each other in the piezoelectric layer (4), and located between the first electrode (51) and the second electrode (52). The acoustic wave device (1; 1a; 1b; 1c; 1d) satisfies a relationship of MR≤1.75×(d/p)+0.075. In this case, S1 is an area of the first electrode principal portion (510) in the plan view from the thickness direction (D1). S2 is an area of the second electrode principal portion (520) in the plan view from the thickness direction (D1). S0 is an area of the defined region (45) in the plan view from the thickness direction (D1). MR is a structural parameter defined by an expression of (S1+S2)/(S1+S2+S0).

According to the above-described preferred embodiment, it is possible to reduce or prevent spurious signals within the band.

An acoustic wave device (1; 1a; 1b; 1c; 1d) according to a preferred embodiment of the present invention, includes the first wiring portion (61) connected to the first electrode (51) and the second wiring portion (62) connected to the second electrode (52).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a piezoelectric layer; and
a first electrode and a second electrode facing each other in a direction crossing a thickness direction of the piezoelectric layer; wherein
a material of the piezoelectric layer is lithium niobate or lithium tantalate;
each of the first electrode and the second electrode includes an aluminum layer on the piezoelectric layer; and an orientation direction of a crystal of the aluminum layer is a direction orthogonal or substantially orthogonal to a surface on a piezoelectric layer side of the aluminum layer.

2. An acoustic wave device comprising:
a piezoelectric layer; and
a first electrode and a second electrode facing each other in a direction crossing a thickness direction of the piezoelectric layer; wherein
the first electrode and the second electrode are electrodes adjacent to each other;
when a distance between a center line of the first electrode and a center line of the second electrode is denoted as p, and a thickness of the piezoelectric layer is denoted as d, d/p is not greater than about 0.5 in any cross section along the thickness direction in the acoustic wave device;
a material of the piezoelectric layer is lithium niobate or lithium tantalate;
each of the first electrode and the second electrode includes an aluminum layer on the piezoelectric layer; and
an orientation direction of a crystal of the aluminum layer is a direction orthogonal or substantially orthogonal to a surface on the piezoelectric layer side of the aluminum layer.

3. The acoustic wave device according to claim 1, wherein the first electrode and the second electrode face each other on a same principal surface of the piezoelectric layer.

4. The acoustic wave device according to claim 1, wherein the orientation direction is orthogonal or substantially orthogonal to a principal surface of the piezoelectric layer.

5. The acoustic wave device according to claim 1, wherein the aluminum layer is an epitaxial layer.

6. The acoustic wave device according to claim 1, wherein Euler angles ($\varphi$, $\theta$, $\psi$) of the piezoelectric layer are about (0°±10°, 0°±10°, $\psi$).

7. The acoustic wave device according to claim 2, wherein d/p discussed above is not greater than about 0.24.

8. The acoustic wave device according to claim 7, wherein
the first electrode and the second electrode are electrodes adjacent to each other;
the first electrode includes a first electrode principal portion intersecting with the second electrode in a direction in which the first electrode and the second electrode face each other;
the second electrode includes a second electrode principal portion intersecting with the first electrode in the direction in which the first electrode and the second electrode face each other;
the piezoelectric layer includes a defined region intersecting with both the first electrode and the second electrode in the direction in which the first electrode and the second electrode face each other in the piezoelectric layer, and located between the first electrode and the second electrode, in a plan view from the thickness direction; and
in the plan view from the thickness direction, when an area of the first electrode principal portion is denoted as S1, an area of the second electrode principal portion is denoted as S2, an area of the defined region is denoted as S0, and a structural parameter defined by an expression of (S1+S2)/(S1+S2+S0) is denoted as MR, the acoustic wave device satisfies a condition of MR≤1.75×(d/p)+0.075.

9. The acoustic wave device according to claim 1, further comprising:
a first wiring portion connected to the first electrode; and
a second wiring portion connected to the second electrode.

10. The acoustic wave device according to claim 2, wherein the first electrode and the second electrode face each other on a same principal surface of the piezoelectric layer.

11. The acoustic wave device according to claim 2, wherein the orientation direction is orthogonal or substantially orthogonal to a principal surface of the piezoelectric layer.

12. The acoustic wave device according to claim 2, wherein the aluminum layer is an epitaxial layer.

13. The acoustic wave device according to claim 2, wherein Euler angles ($\varphi$, $\theta$, $\psi$) of the piezoelectric layer are about (0°±10°, 0°±10°, $\psi$).

14. The acoustic wave device according to claim 2, further comprising:
a first wiring portion connected to the first electrode; and
a second wiring portion connected to the second electrode.

15. The acoustic wave device according to claim 1, further comprising:
a support substrate;
an acoustic reflection layer on the support substrate; wherein
the piezoelectric layer is on the acoustic reflection layer.

16. The acoustic wave device according to claim 1, further comprising:
a support substrate including a cavity; and
a silicon oxide layer; wherein
the piezoelectric layer is bonded to the support substrate with the silicon oxide layer interposed therebetween; and
the cavity located below the piezoelectric layer.

17. The acoustic wave device according to claim 16, wherein the cavity extends through the support substrate and the silicon oxide layer.

18. The acoustic wave device according to claim 2, further comprising:
a support substrate;
an acoustic reflection layer on the support substrate; wherein
the piezoelectric layer is on the acoustic reflection layer.

19. The acoustic wave device according to claim 2, further comprising:
a support substrate including a cavity; and
a silicon oxide layer; wherein
the piezoelectric layer is bonded to the support substrate with the silicon oxide layer interposed therebetween; and
the cavity located below the piezoelectric layer.

20. The acoustic wave device according to claim 19, wherein the cavity extends through the support substrate and the silicon oxide layer.

* * * * *